(12) United States Patent
Dang et al.

(10) Patent No.: US 9,865,569 B2
(45) Date of Patent: Jan. 9, 2018

(54) PLANARITY-TOLERANT REWORKABLE INTERCONNECT WITH INTEGRATED TESTING

(71) Applicant: International Business Machines Corporation, Armonk, NY (US)

(72) Inventors: Bing Dang, Chappaqua, NY (US); John U. Knickerbocker, Monroe, NY (US); Yang Liu, Ossining, NY (US); Yu Luo, Hopewell Junction, NY (US); Steven L. Wright, Cortlandt Manor, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/137,123

(22) Filed: Apr. 25, 2016

(65) Prior Publication Data

US 2016/0240513 A1 Aug. 18, 2016

Related U.S. Application Data

(60) Division of application No. 14/516,963, filed on Oct. 17, 2014, now Pat. No. 9,391,040, and a
(Continued)

(51) Int. Cl.
*H01L 25/065* (2006.01)
*H01L 23/00* (2006.01)
(Continued)

(52) U.S. Cl.
CPC ........ *H01L 25/0657* (2013.01); *H01L 21/563* (2013.01); *H01L 21/6835* (2013.01); *H01L 22/20* (2013.01); *H01L 23/13* (2013.01); *H01L 23/3157* (2013.01); *H01L 23/3178* (2013.01); *H01L 23/49811* (2013.01); *H01L 23/49894* (2013.01); *H01L 23/50* (2013.01);
(Continued)

(58) Field of Classification Search
CPC . H01L 2224/16145; H01L 2224/16225; H01L 21/76885; H01L 2224/16227; H01L 2224/17181; H01L 2224/16235; H01L 2224/81234; H01L 2224/81815; H01L 23/147; H01L 24/16; H01L 25/0657; G01R 1/067
See application file for complete search history.

(56) References Cited

U.S. PATENT DOCUMENTS 6,294,837 B1 9/2001 Akram et al.
6,342,399 B1 1/2002 Degani
(Continued)

FOREIGN PATENT DOCUMENTS

WO 9614660 5/1996

*Primary Examiner* — Roy Potter
*Assistant Examiner* — Paul Patton
(74) *Attorney, Agent, or Firm* — Law Office of Charles W. Peterson, Jr.; Louis J. Percello, Esq.

(57) ABSTRACT

A structure includes an electrical interconnection between a first substrate including a plurality of protrusions and a second substrate including a plurality of solder bumps, the plurality of protrusions includes sharp tips that penetrate the plurality of solder bumps, and a permanent electrical interconnection is established by physical contact between the plurality of protrusions and the plurality of solder bumps including a metallurgical joint.

17 Claims, 22 Drawing Sheets

Related U.S. Application Data continuation-in-part of application No. 14/708,198, filed on May 9, 2015, and a continuation-in-part of application No. 14/187,237, filed on Feb. 22, 2014, now Pat. No. 9,070,586.

(51) Int. Cl.

| | | |
|---|---|---|
| *H01L 25/00* | (2006.01) | |
| *H01L 23/498* | (2006.01) | |
| *H01L 21/56* | (2006.01) | |
| *H01L 23/31* | (2006.01) | |
| *H01L 21/683* | (2006.01) | |
| *H01L 23/50* | (2006.01) | |
| *H01L 23/13* | (2006.01) | |
| *H01L 21/66* | (2006.01) | |
| *H01L 23/48* | (2006.01) | |

(52) U.S. Cl.
CPC .............. *H01L 24/11* (2013.01); *H01L 24/17* (2013.01); *H01L 24/81* (2013.01); *H01L 25/50* (2013.01); *H01L 22/14* (2013.01); *H01L 23/3114* (2013.01); *H01L 23/481* (2013.01); *H01L 2221/6834* (2013.01); *H01L 2221/68327* (2013.01); *H01L 2221/68359* (2013.01); *H01L 2221/68381* (2013.01); *H01L 2224/11334* (2013.01); *H01L 2224/16146* (2013.01); *H01L 2224/16148* (2013.01); *H01L 2224/16235* (2013.01); *H01L 2224/16238* (2013.01); *H01L 2224/1701* (2013.01); *H01L 2224/1712* (2013.01); *H01L 2224/1751* (2013.01); *H01L 2224/17104* (2013.01); *H01L 2224/81815* (2013.01); *H01L 2225/06513* (2013.01); *H01L 2225/06517* (2013.01); *H01L 2225/06527* (2013.01); *H01L 2225/06541* (2013.01); *H01L 2225/06544* (2013.01); *H01L 2225/06548* (2013.01); *H01L 2225/06555* (2013.01); *H01L 2225/06565* (2013.01)

(56) References Cited

U.S. PATENT DOCUMENTS

| | | | |
|---|---|---|---|
| 6,541,365 | B2 | 4/2003 | Edwards et al. |
| 6,563,215 | B1* | 5/2003 | Akram ............... G01R 1/06711 257/737 |
| 6,900,654 | B2 | 5/2005 | Danziger et al. |
| 7,061,109 | B2 | 6/2006 | Akram |
| 7,126,224 | B2 | 10/2006 | Akram |
| 7,723,156 | B2 | 5/2010 | Salmon |
| RE43,607 | E | 8/2012 | Danziger et al. |
| 8,633,584 | B2 | 1/2014 | Salmon |
| 8,647,922 | B2 | 2/2014 | Zhou et al. |
| 2004/0232560 | A1* | 11/2004 | Su ........................ H01L 21/563 257/778 |
| 2006/0051948 | A1 | 3/2006 | Kim et al. |
| 2009/0201038 | A1* | 8/2009 | Knickerbocker .. G01R 1/07314 324/762.05 |
| 2012/0279287 | A1* | 11/2012 | Andry ..................... G01B 5/28 73/105 |

* cited by examiner

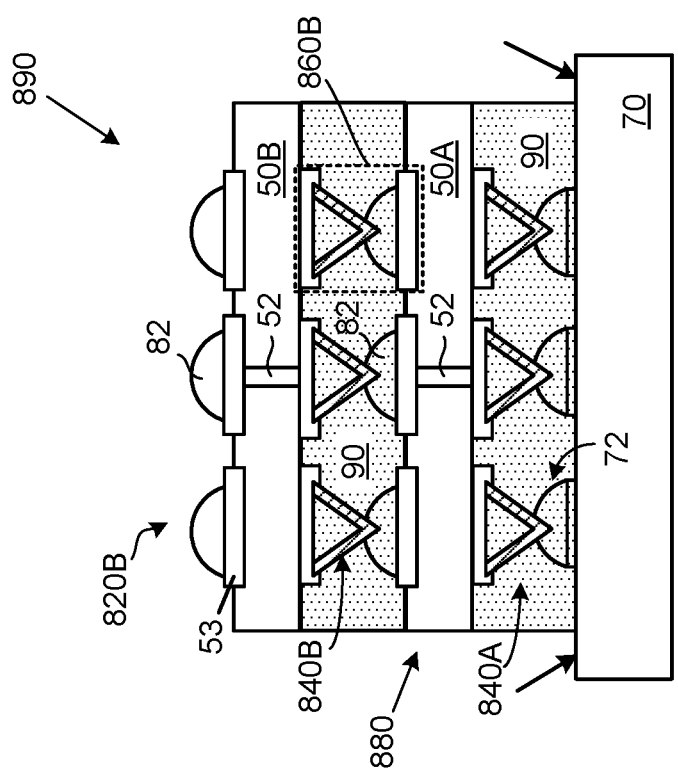
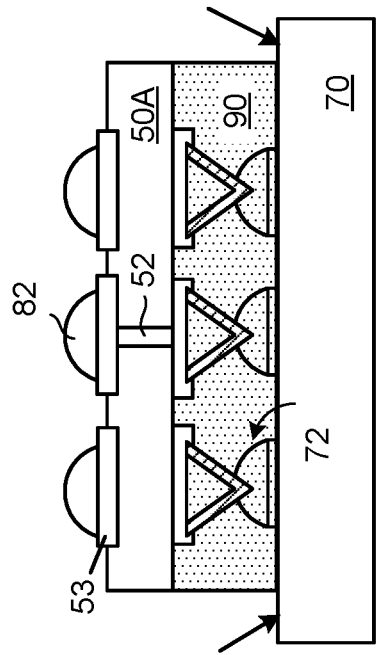
FIG. 32E
FIG. 32F

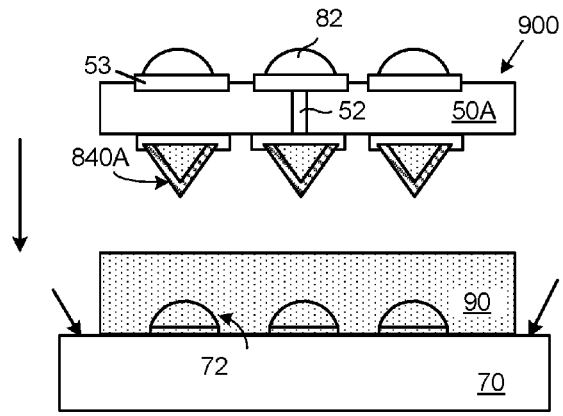
FIG. 33A
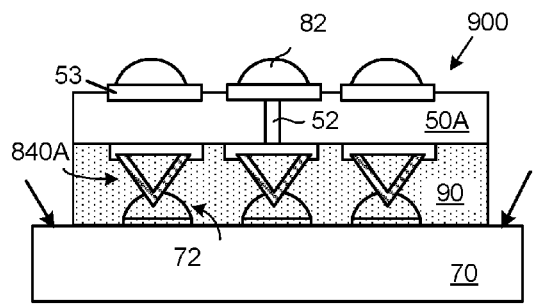
FIG. 33B
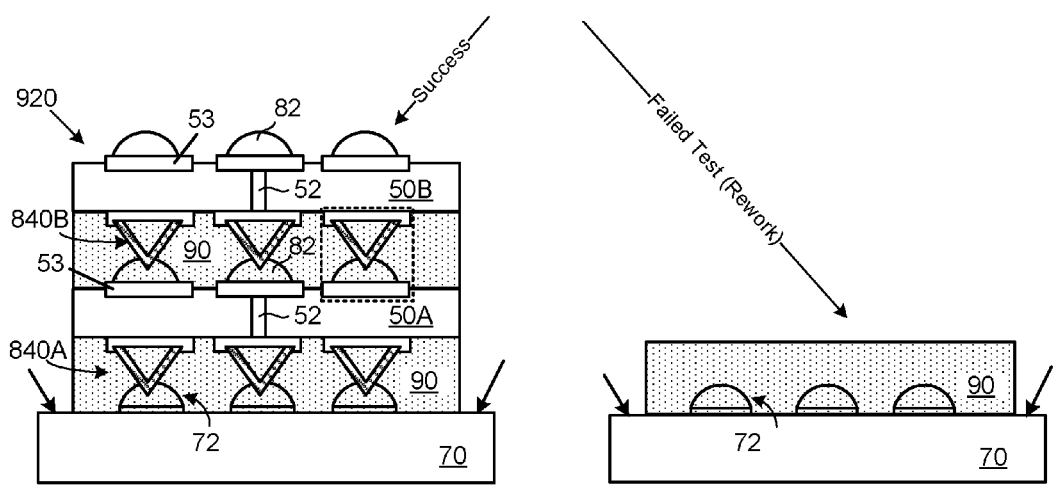
FIG. 33C                    FIG. 33D

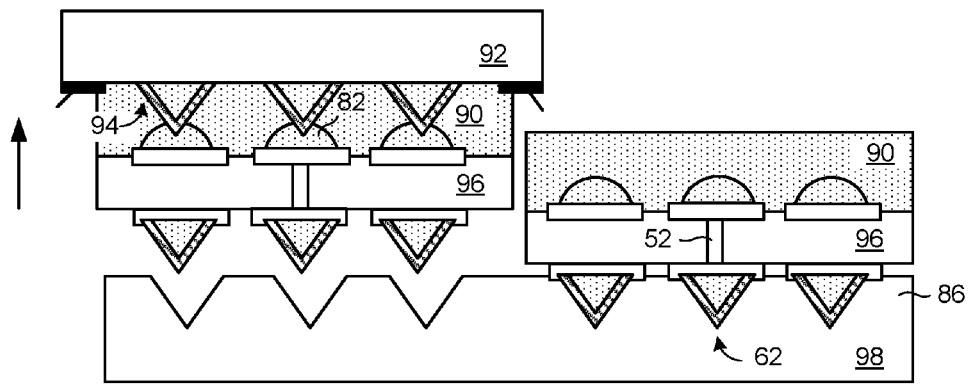
FIG. 34C
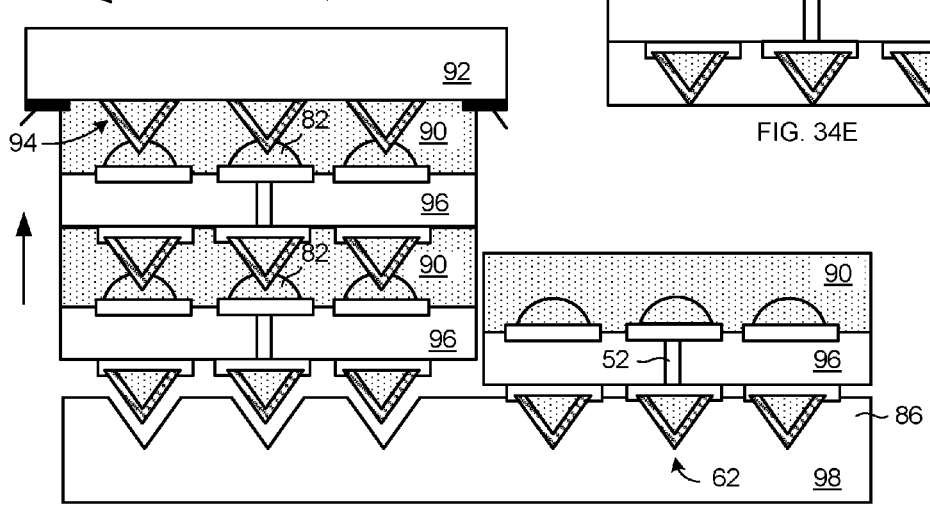
FIG. 34E
FIG. 34D

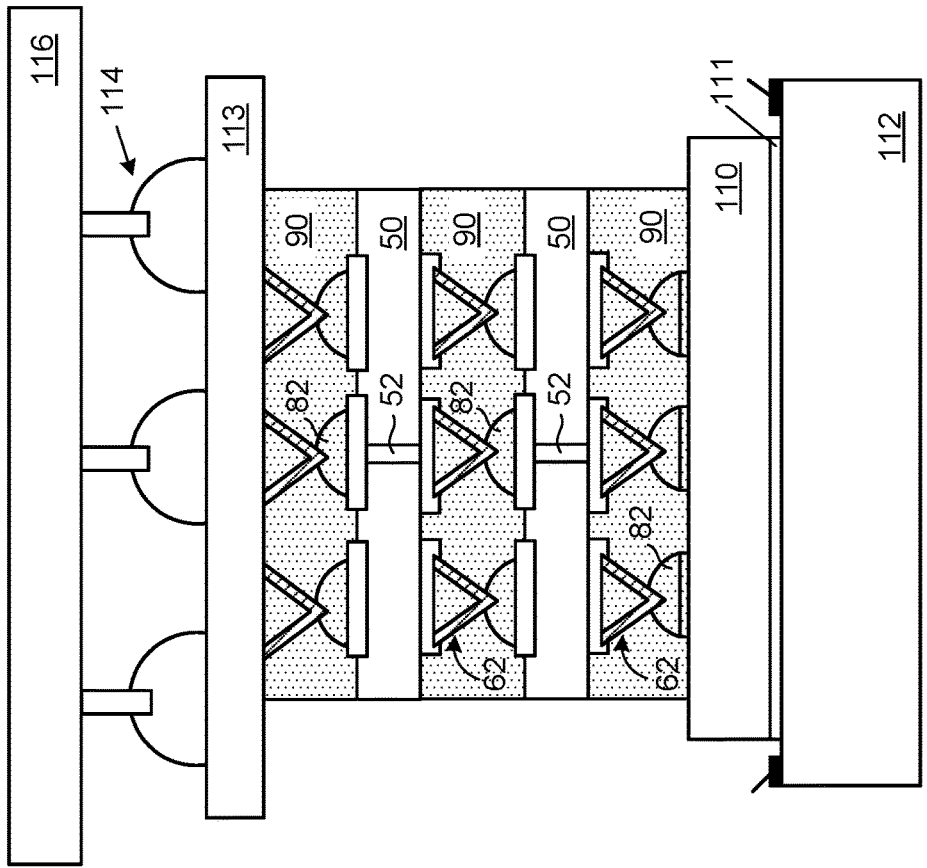
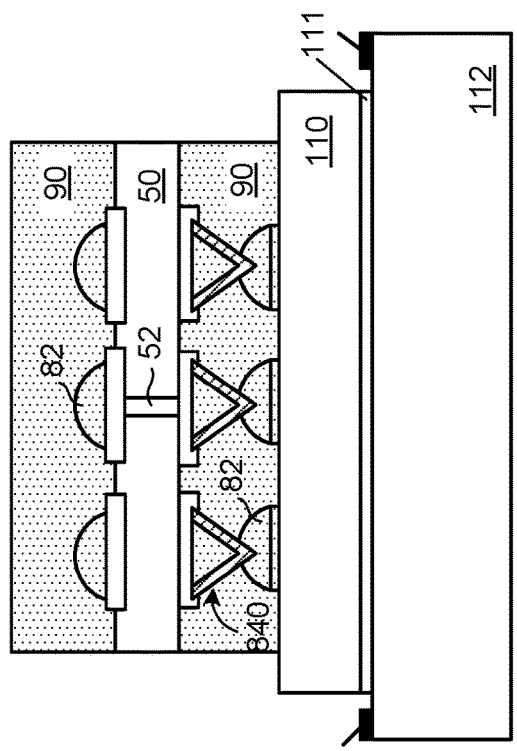
FIG. 35B
FIG. 35A

PLANARITY-TOLERANT REWORKABLE INTERCONNECT WITH INTEGRATED TESTING

CROSS REFERENCE TO RELATED APPLICATION

The present application is a divisional of U.S. patent application Ser. No. 14/516,963, "PLANARITY-TOLERANT REWORKABLE INTERCONNECT WITH INTEGRATED TESTING" to Bing Dang et al. filed Oct. 17, 2014; and a continuation in part of U.S. patent application Ser. No. 14/708,198, "METHOD OF FORMING SURFACE PROTRUSIONS ON AN ARTICLE AND THE ARTICLE WITH THE PROTRUSIONS ATTACHED" to Bing Dang et al. filed May 9, 2015, and of U.S. Pat. No. 9,070,586, "METHOD OF FORMING SURFACE PROTRUSIONS ON AN ARTICLE AND THE ARTICLE WITH THE PROTRUSIONS ATTACHED" to Bing Dang et al., filed Feb. 22, 2014 and issued Jun. 30, 2015; and related to U.S. patent application Ser. No. 14/962,331, "TEST PROBE HEAD FOR FULL WAFER TESTING" to Bing Dang et al. filed Dec. 8, 2015; all assigned to the assignee of the present invention and incorporated herein by reference.

BACKGROUND

The present invention generally relates to semiconductor manufacturing and more particularly to fabricating reworkable interconnect structures having integrated testing capabilities.

Typical semiconductor integrated circuit (IC) chips may have layers stacked such that layer features overlay one another to form individual devices and connect devices together. ICs are mass produced by forming an array of chips on a thin semiconductor wafer. Each array location is known as a die and each die may harbor a multilayered structure, such as an IC chip or a structure for test or alignment.

As transistor technologies advance, chip features and devices are increasingly smaller having minimum dimensions that may be well below one micrometer (1 µm) or 1 micron. Smaller chip features and devices allow IC manufacturers to integrate more function in the same chip real estate. However, scaling of wafer test probes to finer pitch may pose numerous challenges, as the cost and complexity of wafer probe technology increases. By way of example, in existing approaches, challenges in test probe manufacturing may include scalability, material selection flexibility, and cost of fabrication. Probe card and test probe technologies have been adapted to cover area array interconnection pitches down to the range of 150-200 microns. These technologies may not offer a workable solution for fine-pitch probing in three-dimensional (3D) silicon devices with area array pitches 50 microns and smaller.

SUMMARY

According to an embodiment of the present disclosure, a structure may include an electrical interconnection between a first substrate including a plurality of protrusions and a second substrate including a plurality of solder bumps, the plurality of protrusions may include sharp tips that penetrate the plurality of solder bumps, and a permanent electrical interconnection may be established by physical contact between the plurality of protrusions and the plurality of solder bumps including a metallurgical joint.

According to another embodiment of the present disclosure, a structure may include a substrate including a plurality of protrusions on a surface of the substrate, and a plurality of solder bumps on an opposite surface of the substrate, the plurality of protrusions may include substantially sharp tips that penetrate a solder compound, an electrical connection may exist between the plurality of protrusions and the plurality of solder bumps.

According to another embodiment of the present disclosure, a structure may include an electrical interconnection between a first substrate including a plurality of protrusions on a first surface of the first substrate, a second substrate including a plurality of solder bumps on a first surface of the second substrate, and a plurality of protrusions on a second opposite surface of the second substrate, an electrical interconnection may exist within the second substrate between the plurality of solder bumps and the plurality of protrusions on the second substrate, the plurality of protrusions on the first substrate comprises sharp tips that may penetrate the plurality of solder bumps on the second substrate, a permanent electrical interconnection may be established by physical contact between the plurality of protrusions on the first substrate and the plurality of solder bumps on the second substrate including a metallurgical joint.

According to another embodiment of the present disclosure, a method may include forming a plurality of protrusions on a substrate surface, the substrate may include a plurality of devices known to be electrically-good, and forming one or more dies, each of the one or more dies may include a plurality of protrusions on one side of each of the one or more dies and a plurality of solder bumps on an opposite side of each of the one or more dies, the plurality of protrusions on one side of each of the one or more dies may be electrically connected to the plurality of solder bumps within each of the one or more dies, the plurality of protrusions on each of the one or more dies may be brought into contact with the plurality of solder bumps on an adjacent die of the one or more dies to form a temporary electrical interconnection forming a stack of dies, the plurality of devices known to be electrically-good may be used to test each of the one or more dies to form a chip stack.

According to another embodiment of the present disclosure, a method may include forming a plurality of protrusions on a first template carrier substrate, attaching the first template carrier substrate to a first surface of a second substrate, thinning the second substrate to a desired thickness, forming a plurality of solder bumps on an opposite second surface of the second substrate, using the first template carrier substrate as a handler to attach the plurality of solder bumps to a third substrate including a plurality of protrusions to mate with the plurality of solder bumps, and removing the first template carrier substrate.

According to another embodiment of the present disclosure, a method may include forming an underfill region between a first substrate connected to a second substrate, the mating surfaces may include a plurality of protrusions and a plurality of solder bumps, the plurality of protrusions and the plurality of solder bumps may be electrically connected to each other by physical contact, the underfill region may fill a space between the first substrate and the second substrate surrounding the plurality of protrusions and the plurality of solder bumps, and conducting an electrical test, after a successful test result the underfill region may be cured forming a permanent electrical interconnection.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIGS. 32A-32F are cross-sectional views of a semiconductor structure depicting using reworkable interconnects for assembly and test of 2.5D or 3D structures, according to an embodiment of the present disclosure;

FIGS. 33A-33D are cross-sectional views of a semiconductor structure depicting using reworkable interconnects for assembly and test of 2.5D or 3D structures, according to an embodiment of the present disclosure;

FIGS. 34A-34E are cross-sectional views of a semiconductor structure depicting using reworkable interconnects for assembly and test of 2.5D or 3D structures, according to an embodiment of the present disclosure;

FIGS. 35A-35B are cross-sectional views of a semiconductor structure depicting using reworkable interconnects for assembly and test of 2.5D or 3D structures, according to an embodiment of the present disclosure.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
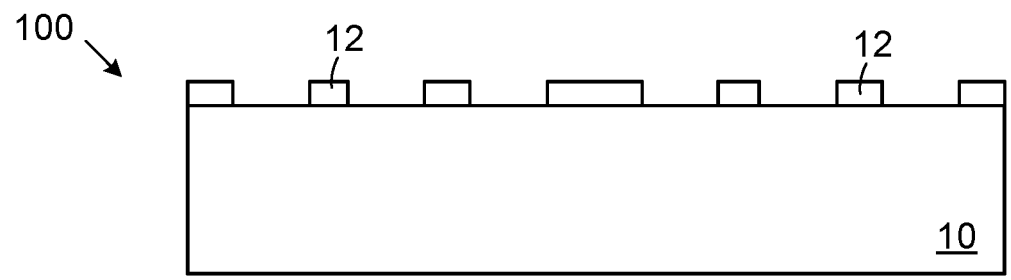
FIGS. 1A-1F are cross-sectional views of a semiconductor structure depicting forming transferable tips, according to an embodiment of the present disclosure.

Detailed embodiments of the claimed structures and methods are disclosed herein; however, it may be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it may be directly on the other element or intervening elements may also be present. In contrast, when an element is referred to as being "directly on" or "directly over" another element, there are no intervening elements present. It will also be understood that when an element is referred to as being "beneath," "below," or "under" another element, it may be directly beneath or under the other element, or intervening elements may be present. In contrast, when an element is referred to as being "directly beneath" or "directly under" another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

3D chip stack assemblies may require fine-pitch test access in order to improve yield. However, fine-pitch probes may be more susceptible to physical damage than traditional coarse-pitch probes. In fine-pitch probes, micro-scale contaminants may accumulate on the probe head, and the small dimensions of the fine-pitch probes may not allow proper cleaning of the probe head. Additionally, fine-pitch probes may require costly interposer and probe card build and maintenance which may make wafer-level probe head at fine-pitch even more challenging. Also, probing microbumps or micro-pillars may leave bump damage that may adversely affect assembly and reliability.

Furthermore, for 3D fine-pitch chip stacks, a reworkable interconnect structure may be required if the interconnect structure and/or the layer fails the test. Current methods may include choosing known-good-dies (KGD), stacking two or more layers, and then perform the test. If the chip stack passes the test, then more layers are stacked on the previously tested stack. If any layer or connection is bad, the whole stack may need to be discarded which may substantially increase manufacturing costs. Additionally, 3D stacking and assembly may suffer from cumulative yield if three or more layers are stacked without testing and selection of the KGD. The yield of the whole stack is generally the product of the yield of each layer, assuming the yield of interconnects between the chips may vary between approximately 99.99% to approximately 99.9999%. Another assumption may include that the test of an individual 3D layer may have a 100% coverage and may be independent from the rest of the stack. Yet another assumption may include that the assembled partial stack may not be influenced by the following assembly steps. Nowadays, the aforementioned assumptions may be impractical in 3D manufacturing technologies. In current micro-bump and micro-pillar metallurgical bonding technologies, the whole stack may have to be discarded if it fails a test. This may lead to a final product having substantially low yield and high production costs.

Moreover, thermal management of a 3D stack may become a challenge simply due to a higher heat density. A possible solution to remove heat may be including a thermal underfill loaded with more thermally conductive fillers. When the interlayer interconnect pitch becomes finer, capillary underfill loaded with higher filler content may not flow as easily in the fine gap existing between the layers. Fillers in pre-applied underfills may also get trapped between the bump and pads and cause poor electrical and mechanical connections.

Therefore, by forming reworkable interconnects, embodiments of the present disclosure may, among other potential benefits, allow the use of traditional coarse-pitch probes to test a 3D stack at fine pitch, avoid fine pitch test probe wearing and cleaning, allow testing of multiple layers and interconnects at the same time potentially reducing the number of tests which may ultimately improve device yield and reduce testing and manufacturing costs.

The present invention generally relates to semiconductor manufacturing and more particularly to fabricating reworkable interconnect structures having integrated testing capabilities. One way to form a reworkable interconnect structure having integrated testing capabilities may include forming protrusions and electrically connecting them to a plurality of interconnect structures by means of a bonding process.

One embodiment by which to form a wafer-level probe head is described in detail below by referring to the accompanying drawings in FIGS. 2-8.

Figure 1B:
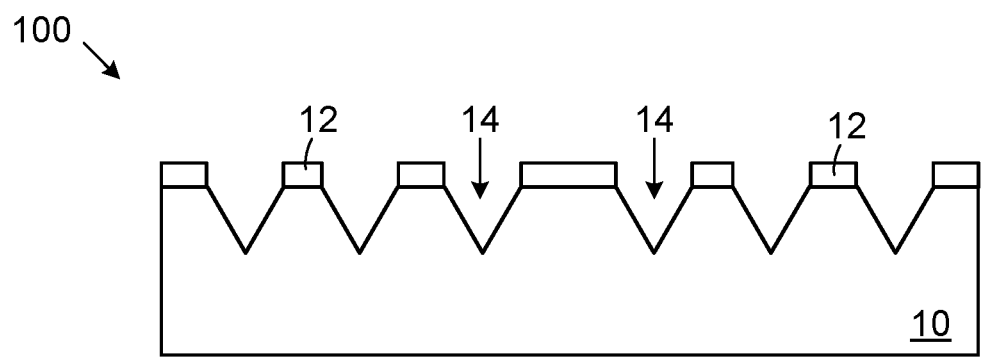

Referring now to FIGS. 1A-1F, a sequence of known processing steps conducted to form a plurality of transferable tips in a substrate is depicted, according to an embodiment of the present disclosure. FIG. 1A depicts a semiconductor structure 100 formed by a substrate 10 and a hard mask layer 12. In one embodiment, the substrate 10 may be, for example, a patterned silicon wafer with a hard mask layer 12 made of, for example, silicon dioxide. An anisotropic etching technique may be employed to form the pits 14 as depicted in FIG. 1B. More specifically, an anisotropic silicon etch such as, for example, a tetramethylammonium hydroxide (TMAH) wet etch may be conducted. Anisotropic etchants may have etch rates along <111> directions of the crystal lattice which may be substantially slower than other directions, resulting in the inverted pyramid shape observed in the pits 14 (FIG. 1B). In one embodiment, the pits 14 may have an inverted pyramid shape with a square base and equilateral triangle shaped sides. It may be understood that after conducting the etching technique, the pits 14 may be bounded by the silicon substrate <111> crystal planes.

It should be noted that for the purpose of forming transferable tips for reworkable interconnects or forming test probes for wafer-level probe head, the pits 14 may have a depth ranging between approximately 1 μm to approximately 35 μm. In a preferred embodiment, the pits 14 may be approximately 8 μm deep, with a surface width or side varying between approximately 1 μm and approximately 50 μm, preferably approximately 10 μm. At this processing step, the hard mask layer 12 may be removed by means of any etching technique known in the art.

Figure 1C:
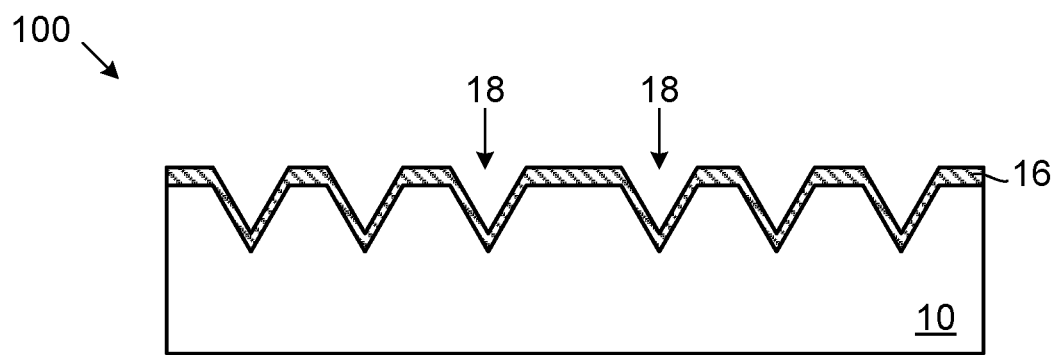

A low adhesion layer 16 may be formed in the pits 14 as depicted in FIG. 1C. The low adhesion layer 16 may conformally coat each of the pits 14 (FIG. 1B). The pits 14 coated by the low adhesion layer 16 may provide a non-planar surface that may cause local current crowding in the pits 14 that may help nucleation in the pits 14 without risking current stability because the anchoring effect may allow continuous current supply. Further, the pits 14 may provide a fluid boundary layer, which may allow for mass transfer by diffusion rather than bulk flow, and that may prevent bath agitation from unintentionally detaching nucleates. Moreover, when electroplating a continuous film on the substrate 10, the low adhesion layer 16 in cooperation with the underlying structure (pits 14 in the substrate 10) may anchor the film to prevent delamination, while supplying stable, uniform current for continuous deposition. Because the nucleate may adhere to the low adhesion layer 16, and the low adhesion layer 16 may adhere to the pits 14 and horizontal surfaces there between, the electroplating solution may remain relatively free of particulate contamination. The pits 14 may allow subsequently plated horizontal film expansion to release stress. Finally, the stressed material forming the substrate 10 may facilitate thicker breakage-free plating, releasing stress both in the metal plated cavities, and by film delamination on flat portions between the pits 14. Further, the substrate 10 may be refreshed and reused for fabricating and attaching transferable testing probes to additional structures as will be described in detail below.

It should be understood that while the low adhesion layer 16 is herein described as a single layer, the low adhesion layer 16 may consist of several layers. In one exemplary embodiment, a base layer, a highly conductive layer, and a surface layer may form the low adhesion layer 16. The base layer may be, for example, titanium (Ti), tantalum (Ta), tantalum nitride (TaN), etc., and may be formed directly on the substrate 10 to insure good adhesion to the substrate 10. The highly conductive layer may be, for example, copper (Cu), silver (Ag) or gold (Au), and may be formed on the base layer to insure uniform current distribution, and to maintain current stability during electroplating. The surface layer may be, for example, titanium (Ti), stainless steel, chromium (Cr), etc., and may be formed on the highly conductive layer. Native oxides (not shown) formed on the surface layer may insure sufficiently low adhesion to the surface layer to allow subsequently separating the electroplated material with a relatively low force.

In one embodiment, the low adhesion layer 16 may be deposited to a thickness of approximately 0.01 μm to approximately 1 μm by means of a PVD process, sputter, evaporation, or any other deposition method known in the art. It should be noted that openings or spaces 18 may remain above the low adhesion layer 16.

Figure 1D:
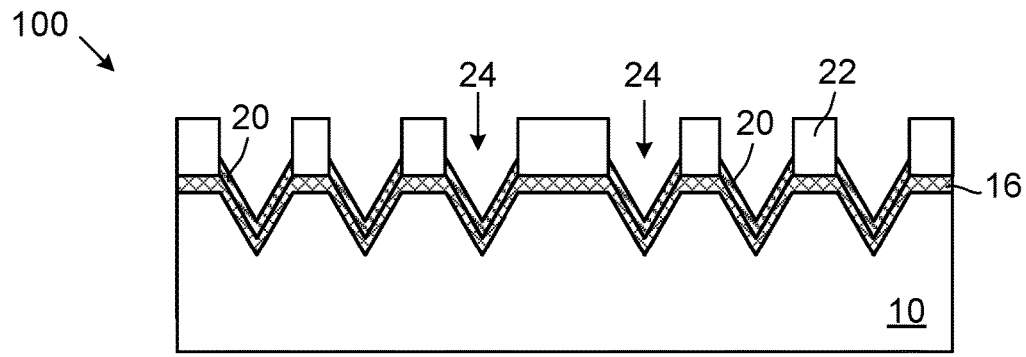

Next, a capping layer 20 may be formed in the openings 18 (FIG. 1C) as depicted in FIG. 1D. The capping layer 20 may form a hard tip cap for a subsequently formed transferable tip. The capping layer 20 may be electroplated to the low adhesion layer 16 after forming and patterning a sacrificial layer 22 on the substrate 10. The patterned sacrificial layer 22 may define the location of each subsequently formed transferable tip. In this embodiment, the capping layer 20 may line uncovered or exposed portions of the low adhesion layer 16 within the openings 18. The capping layer 20 may include nickel (Ni), cobalt (Co), iron (Fe), gold (Au), palladium (Pd) suitable refractory metal or an alloy thereof, and may be electroplated to a thickness of approximately 1 μm to approximately 30 μm. In a preferred embodiment, the capping layer 20 may be approximately 5 μm thick. It should be noted that openings or spaces 24 may remain above the capping layer 20 and between the sacrificial layer 22.

Figure 1E:
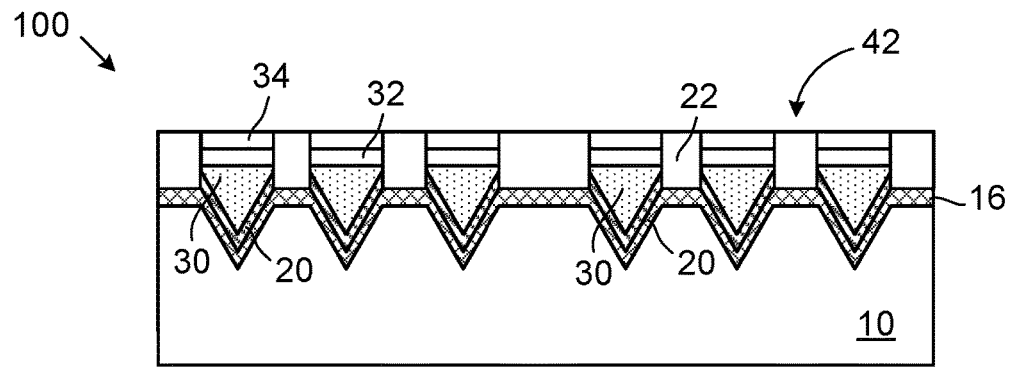

A conductive material 30 may be formed in the openings 24 (FIG. 1D) above and in direct contact with the capping layer 20 as depicted in FIG. 1E. More specifically, the conductive material 30 may be electroplated directly on top of the capping layer 20. The conductive material 30 may be, for example, copper (Cu). The conductive material 30 may have a thickness varying between approximately 1 μm to approximately 100 µm, preferably, the conductive material may be approximately 10 µm thick. Next, a base layer 32 may be electroplated to the conductive material 30. The base layer 32 may be, for example, nickel (Ni). The base layer 32 may have a thickness ranging from approximately 0.5 µm to approximately 3 µm, preferably, the base layer 32 may be approximately 2 µm, thick. A joining material or bonding alloy 34 may be formed above and in direct contact with the base layer 32. The joining material 34 may be electroplated to the base layer 32. The joining material 34 may preferably include a lead-free solder material such as, for example, a tin/silver (Sn/Ag) solder. The joining material 34 may have a thickness ranging from approximately 1 µm to approximately 100 µm, preferably, the joining material may be approximately 10 µm thick. The capping layer 20, the conductive material 30, the base layer 32, and the joining material 34 may substantially fill the openings 24 (FIG. 1D) forming inverted transferable tips (hereinafter "inverted tips") 42.

Figure 1F:
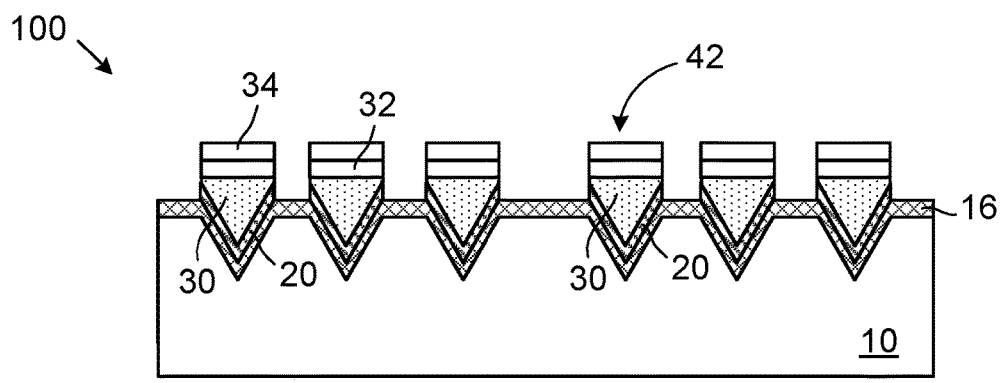

After formation of the inverted tips 42, the sacrificial layer 22 may be removed as depicted in FIG. 1F. Removing the sacrificial layer 22 may include a typical wet strip, rinse, and dry process, which may expose the inverted tips 42. It should be noted that although adhesion between the inverted tips 42 and the low adhesion layer 16 may be low, sufficient adhesion may exist to hold the inverted tips 42 in place when the sacrificial layer 22 is stripped.

The inverted tips 42 may now be transferred and attached to additional structures for appropriate usage. In the following figures, the transferable inverted tips 42 may be used to form fine-pitch wafer-level probe heads as illustrated in FIGS. 2-8 and to form semiconductor structures having solder bumps and protrusions as illustrated in FIGS. 9-16.

Figure 2:
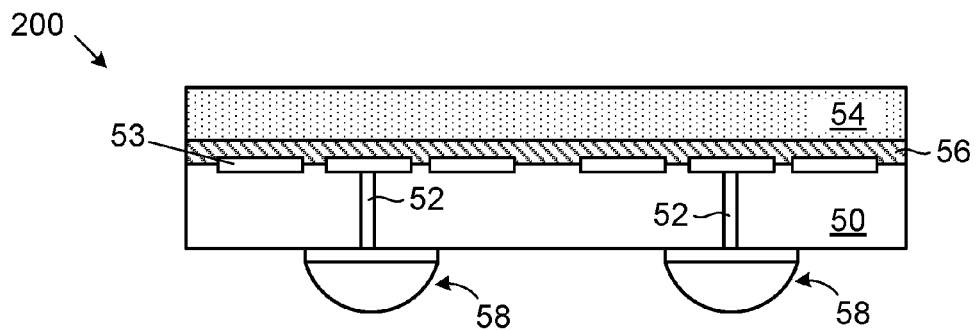
FIGS. 2-8 are cross-sectional views of a semiconductor structure depicting forming a wafer-level probe head using the transferable tips, according to an embodiment of the present disclosure.

Referring now to FIG. 2, a semiconductor structure 200 including a substrate layer 50 is depicted, according to an embodiment of the present disclosure. The substrate layer 50 may include a functional 2.5D or 3D layer, for example, in one embodiment, the substrate layer 50 may include a 3D silicon or glass die containing interconnect structures 52. The substrate layer 50 may have a thickness ranging from approximately 10 µm to approximately 1,000 µm. The interconnect structures 52 may include, for example, through-silicon vias (TSVs), through-glass vias (TGVs). The substrate layer 50 may include a surface pad 53. The surface pad 53 may allow connecting the substrate layer 50 to additional substrates or semiconductor structures as will be described below.

The substrate layer 50 may be attached to a carrier substrate 54 by means of an adhesion layer 56. In one embodiment, the carrier substrate 54 may include a silicon wafer. In another embodiment, the carrier substrate 54 may include a glass wafer. The adhesion layer 56 may include, for example, an adhesive material. The carrier substrate 54 may serve to transfer or move the substrate layer 50 for additional semiconductor processes including bonding to another semiconductor structure or substrate. The substrate layer 50 may further include solder bumps 58 formed on a bottom surface of the substrate layer 50. The solder bumps 58 may allow attaching the semiconductor structure 200 to another semiconductor structure or substrate, as will be described in detail below. It should be noted that the process of forming the solder bumps 58 may be typical and well known to those skilled in the art.

Figure 3:
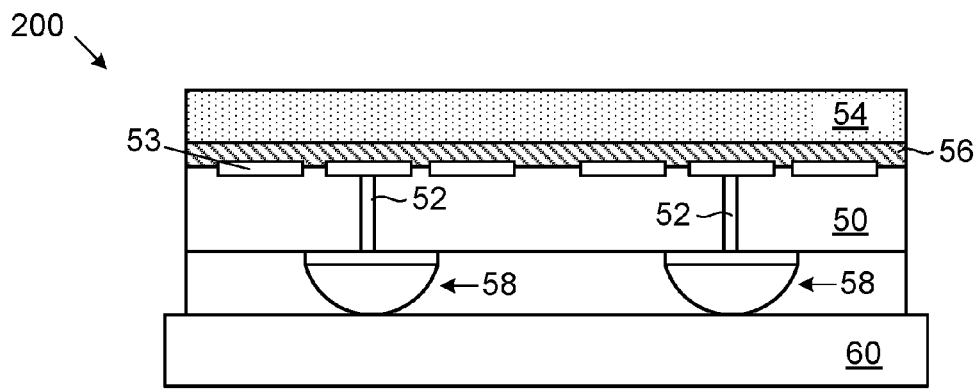

Referring now to FIG. 3, the substrate layer 50 may be transferred and joined to an interposer substrate 60, according to an embodiment of the present disclosure. The substrate layer 50 may be placed above the interposer substrate 60 using the carrier substrate 54. In one embodiment, the interposer substrate 60 may include ceramic, organic glass, or silicon with single or multiple redistribution layers. Then, the substrate layer 50 may be bonded or joined to the interposer substrate 60 by reflowing the solder bumps 58. Alternatively, an underfill (not shown) may be applied to improve reliability and mechanical properties of the stack.

Figure 4:
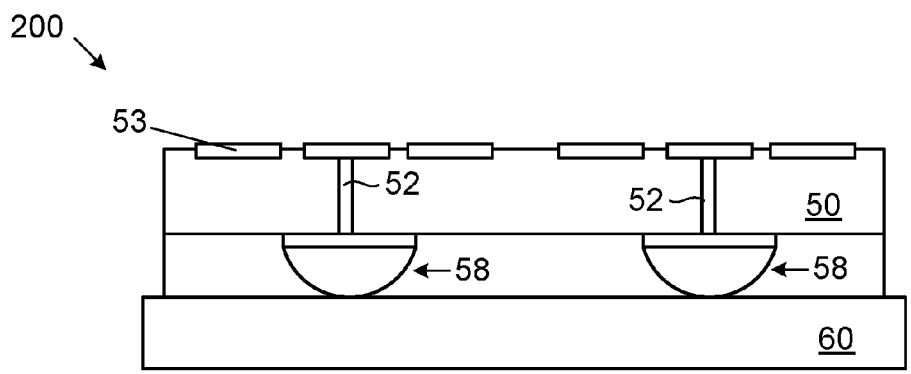

Referring now to FIG. 4, after attaching the substrate layer 50 to the interposer substrate 60, the carrier substrate 54 and the adhesion layer 56 may be separated from the substrate layer 50, according to an embodiment of the present disclosure. It should be noted that by releasing the carrier substrate 54, the surface pads 53 in the substrate layer 50 may be exposed.

Figure 5:
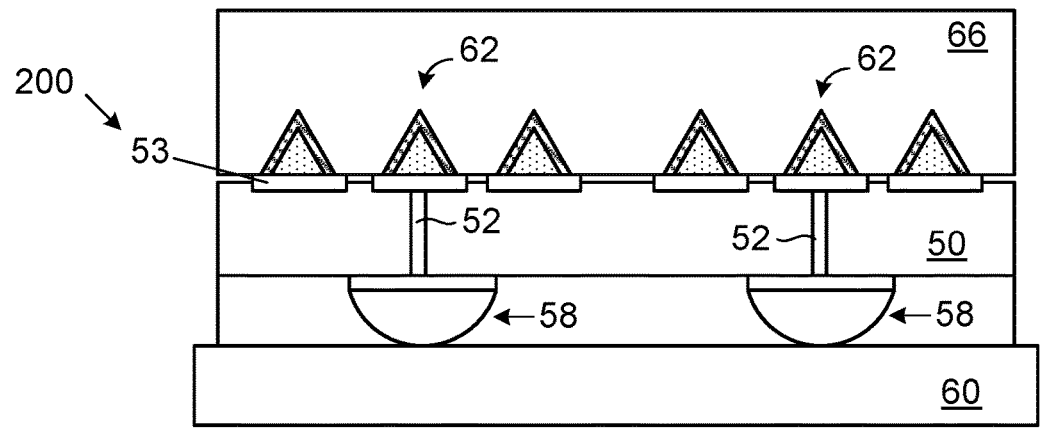

Referring now to FIG. 5, a plurality of transferable tips 62 may be transferred to the structure 200, according to an embodiment of the present disclosure. More specifically, the transferable tips 62 may be attached to the surface pads 53 on the substrate layer 50. The transferable tips 62 may be similarly formed and may contain the same components as the inverted tips 42 described above with reference to FIGS. 1A-1F. For illustration purposes only, without intent of limitation some of the components shown in the inverted tips 42 (FIGS. 1A-1F) have been omitted in the transferable tips 62.

It should be noted that the transferable tips 62 may still be attached to a template substrate 66 similar to the substrate 10 described above with reference to FIGS. 1A-1F.

The transferable tips 62 may be brought into contact with the surface pads 53 on the substrate layer 50 to be joined together. A typical soldering process may be conducted to join the transferable tips 62 and the surface pads 53. In some embodiments, any suitable attachment method including, for example, gluing, may be used for attaching the transferable tips 62 to the surface pads 53.

Figure 6:
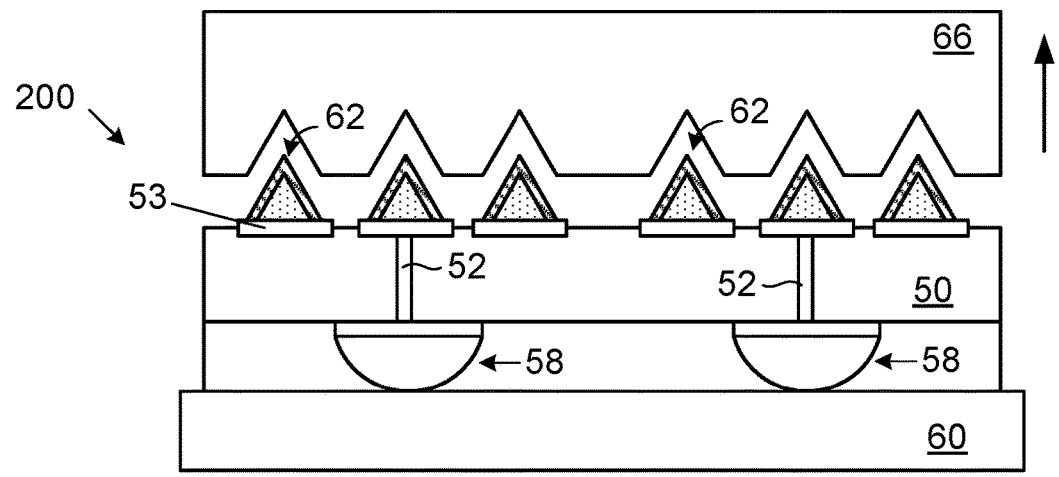

Referring now to FIG. 6, once the transferable tips 62 are attached to the surface pads 53, the template substrate 66 may be separated from the transferable tips 62 and removed from the semiconductor structure 200, according to an embodiment of the present disclosure. The template substrate 66 may be separated from the semiconductor structure 200 by using very little force to pry or pull the template substrate 66 off. In one embodiment, the transferable tips 62 may be joined to any substrate having receiving connection pads, using a traditional flip-chip assembly method.

Figure 7:
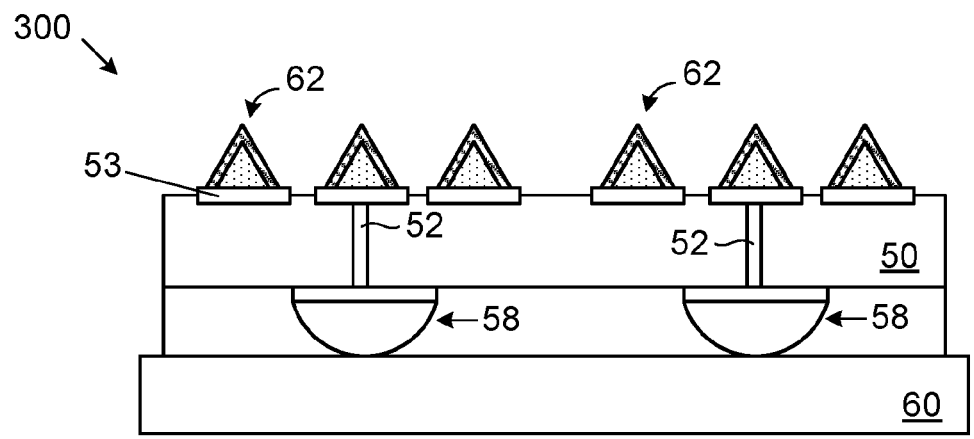

Referring now to FIG. 7, a completed testing structure 300 is depicted, according to an embodiment of the present disclosure. The testing structure 300 may be used to conduct a wafer-level test. More specifically, a target substrate 71 (FIG. 8) may be tested using the testing structure 300 as will be described in detail below with reference to FIG. 8.

Figure 8:
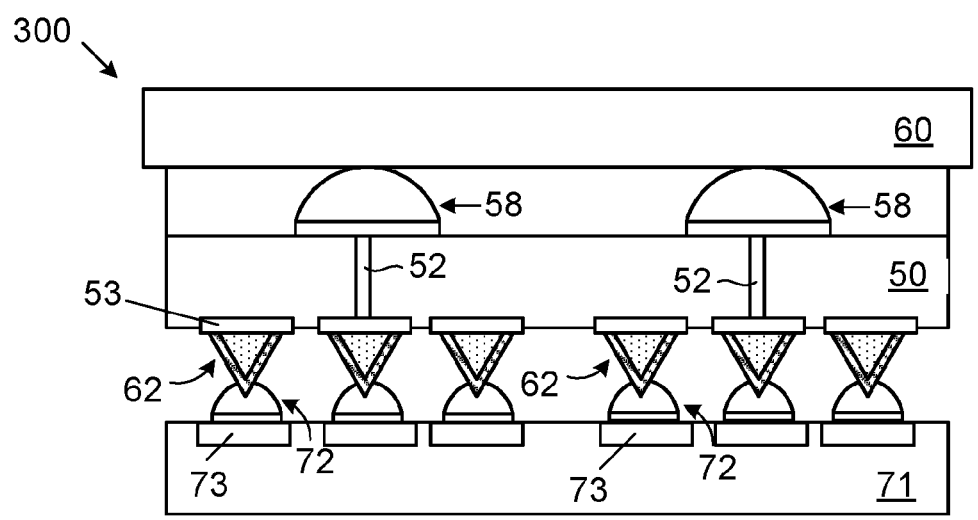

Referring now to FIG. 8, the testing structure 300 may be flipped and place above a target substrate 71 to be tested, according to an embodiment of the present disclosure. The target substrate 71 may include a silicon wafer containing a plurality of devices under test (DUT) 73 (hereinafter "DUT") and a plurality of solder bumps 72 (hereinafter "solder bumps") to be probed. The DUT 73 may be tested by probing the solder bumps 72 connecting to each individual DUT 73. It should be noted that multiple DUT 73 may be contacted and tested simultaneously. In some embodiments, all of the DUT 73 present in the target substrate 71 may be contacted and tested simultaneously. The DUT 73 that may pass the test may then be marked as a known-good die (KGD). It should be noted that once the transferable tips 62 have been transferred and attached to the semiconductor structure 200 to form a testing structure 300, they may alternatively be referred to as "probe tips".

An embodiment by which to use the transferable tip structures and tip transfer process described above to form semiconductor structures having solder bumps and protrusions is described in detail below by referring to the accompanying drawings in FIGS. 9-16.

Figure 9:
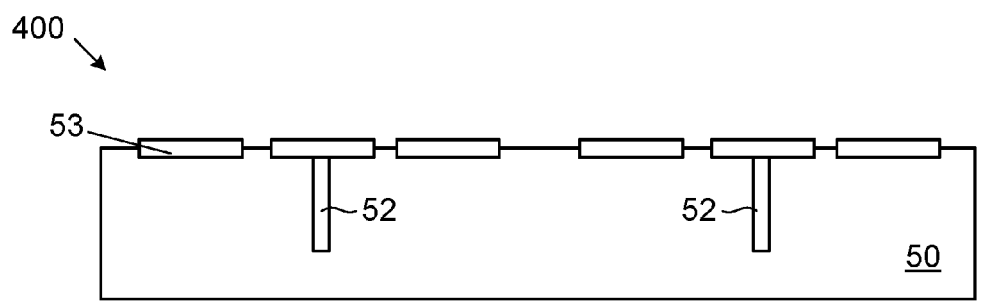
FIGS. 9-16 are cross-sectional views of a semiconductor structure depicting forming semiconductor structures having solder bumps and protrusions, according to an embodiment of the present disclosure.

Referring now to FIG. 9, a semiconductor structure 400 containing a plurality of interconnect structures 52 (hereinafter "interconnect structures") formed in a substrate layer 50 is depicted, according to an embodiment of the present disclosure. The substrate layer 50 may include similar materials and components as the substrate layer 50 described above with reference to FIG. 2. The interconnect structures 52 may include, for example, vias and through-silicon vias (TSVs). The substrate layer 50 may be etched to form the interconnect structures 52 (or via arrays) using typical semiconductor processes, the interconnect structures 52 may be filled with metal to function as an interconnection between a front side and a back side of the substrate layer 50. The substrate layer 50 may also include surface pads 53. The surface pads 53 may allow connecting the substrate layer 50 to additional substrates or semiconductor structures as described above.

Figure 10:
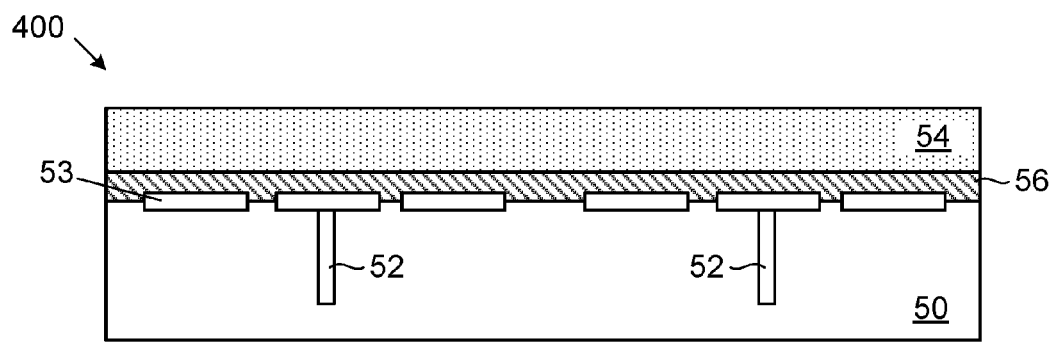

Referring now to FIG. 10, the semiconductor structure 400 may be attached to a carrier substrate 54 by means of an adhesion layer 56, according to an embodiment of the present disclosure. More specifically, the substrate layer 50 may be attached to the carrier substrate 54 through the adhesion layer 56 in order to transfer or move the substrate layer 50 for bonding to another semiconductor structure or substrate. The carrier substrate 54 and adhesion layer 56 may be similar to the ones described above with reference to FIG. 2.

Figure 11:
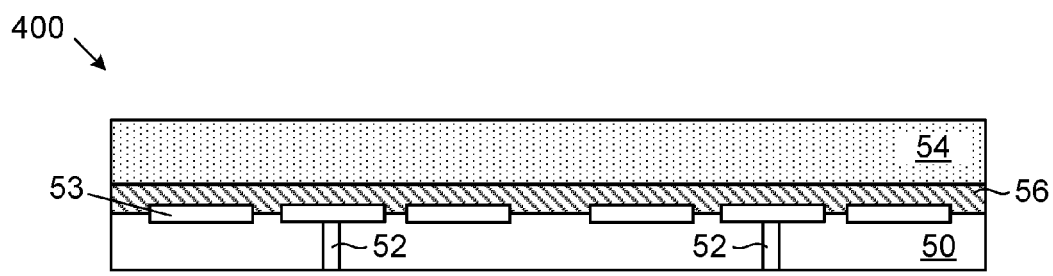

Referring now to FIG. 11, a thinning process may be conducted to reduce a thickness of the substrate layer 50, according to an embodiment of the present disclosure. The thinning process, also referred to as wafer thinning or wafer backgrinding, is typical and well known to those skilled in the art. The thinning process may be conducted to expose the interconnect structures 52.

Figure 12:
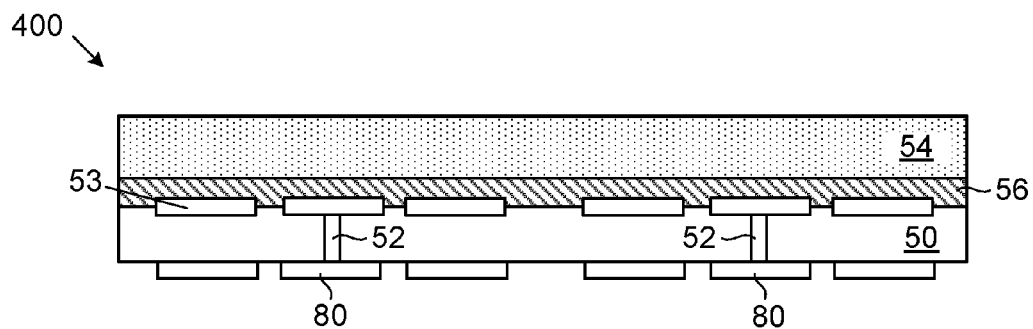

Referring now to FIG. 12, a backside metallization process may be conducted on a bottom surface of the substrate layer 50, according to an embodiment of the present disclosure. Typically, TSVs such as the interconnect structures 52 may be used to connect front and backside circuits of a thinned silicon wafer or chip, mainly due to performance reasons, speed, power consumption, form factor, etc. The backside metallization process is a standard process in semiconductor manufacturing technologies (3D and 2.5D). During this process, a plurality of metal connections 80 (hereinafter "metal connections") may be formed. The metal connections 80 may typically include a Cu/Ni/Au layer. In some embodiments, the metal connections 80 may allow the semiconductor structure 400 to be bonded to micro-bumps and/or micro-pillars in order to connect to a subsequent substrate or structure.

Figure 13:
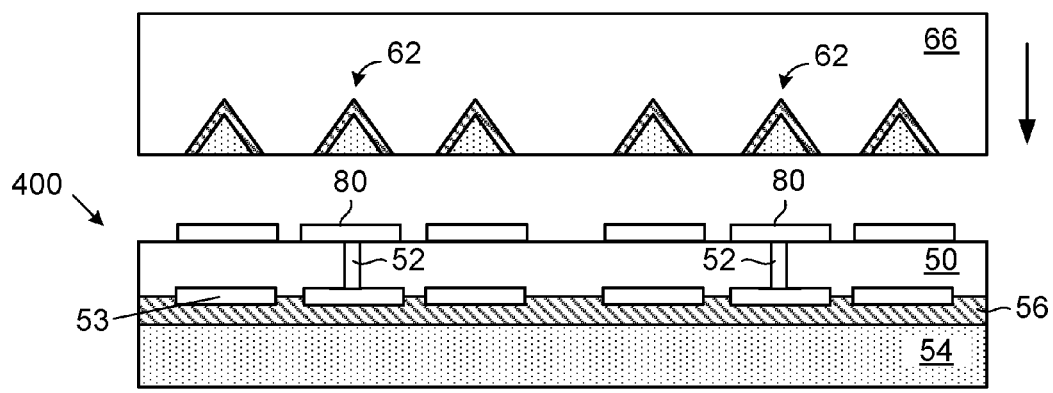

Referring now to FIG. 13, after the backside metallization process is conducted, the semiconductor structure 400 may be flipped, according to an embodiment of the present disclosure. After flipping the semiconductor structure 400, the metal connections 80 formed during the backside metallization process may be brought into contact with a plurality of transferable tips 62 (hereinafter "transferable tips"). The transferable tips 62 may be similarly formed and may contained the same components as the inverted tips 42 described above with reference to FIGS. 1A-1F. It should be noted that the transferable tips 62 may still be attached to a template substrate 66 similar to the substrate 10 (FIGS. 1A-1F).

Figure 14:
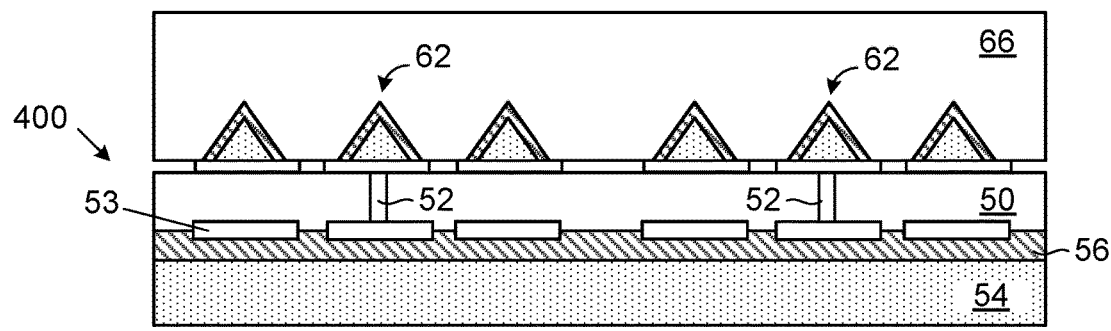

Referring now to FIG. 14, the transferable tips 62 may be transferred to the semiconductor structure 400, according to an embodiment of the present disclosure. More specifically, the transferable tips 62 may be brought into contact with and joined to the exposed metal connections 80 (FIG. 13). A typical soldering process may be conducted to join the transferable tips 62 and the metal connections 80 (FIG. 13). In some embodiments, any suitable attachment method including, for example, gluing, may be used for attaching the transferable tips 62 to the metal connections 80 (FIG. 13).

Figure 15:
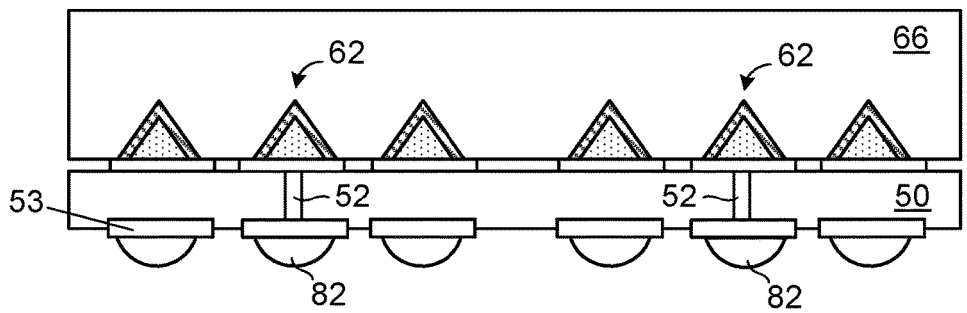

Referring now to FIG. 15, the carrier substrate 54 and the adhesion layer 56 shown in FIG. 14 may be separated from the substrate layer 50, according to an embodiment of the present disclosure. In some embodiments, the carrier substrate 54 (FIG. 14) may be removed from the substrate layer 50 by chemical dissolution, heat decomposition, sliding, or laser release. It should be noted that wafer bonding and debonding processes are typical and well-known to those skilled in the art. After releasing the semiconductor structure 400 from the carrier substrate 54 (FIG. 14), the surface pads 53 may be exposed. Next, the substrate layer 50 may be bumped to form a plurality of solder bumps 82 (hereinafter "solder bumps"). Fine-pitch electroplated solder bump technology is typically used in semiconductor manufacturing for bumping high-end devices. The solder bumps 82 may include bumps or balls made of a solder material such as lead free materials, high lead materials, or Cu pillars capped with such solder. These bumps may not only provide a connected path between a die and a substrate, but may also play an important role in the electrical, mechanical and thermal performance in flip-chip packages.

The solder bumps 82 may include micro-bumps and micro-pillars. Micro-bumps may include bumps at pitches substantially smaller than standard bumps which may typically have pitches in the range of approximately 100-200 µm. In some embodiments, micro-bump pitches may be approximately 80 µm or less. Micro-pillars may typically include a copper pedestal with a height varying from approximately 5 µm to approximately 20 µm, and a solder cap with a thickness typically ranging from approximately 5 µm to approximately 10 µm. For a relatively large ratio of solder thickness to pedestal diameter, the solder cap may appear as a truncated spherical ball. For a relatively small ratio of solder thickness to pedestal diameter, the solder cap may appear to be slightly rounded (sometimes referred to as a pancake bump).

Figure 16:
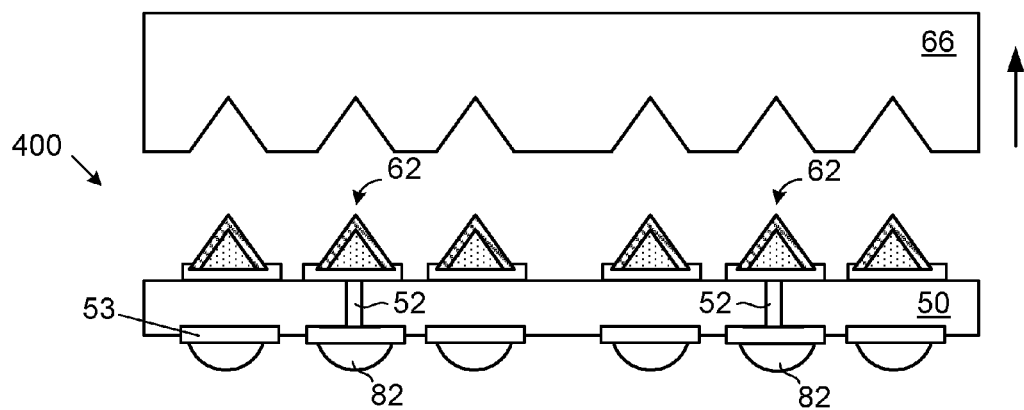

Referring now to FIG. 16, once the solder bumps 82 have been formed, the semiconductor structure 400 may be diced into chips (not shown) and the template substrate 66 may be separated from the semiconductor structure 400, according to an embodiment of the present disclosure. The semiconductor structure 400 may be separated from the template substrate 66 by using very little force to pry or pull the semiconductor structure 400 off. A vacuum head may provide enough force to hold the semiconductor structure 400 and separate the semiconductor structure 400 from the template substrate 66.

After forming the semiconductor structure 400 as depicted in FIG. 16, the testing process may start concurrently with a chip stack bonding process by choosing a known-good die (KGD) full-thickness bottom-layer silicon chip (not shown). A known-good die may include devices which have been tested to be electrically-good and fully-functional. In a preferred embodiment, the bottom-layer silicon chip may contain functional circuits, including circuits for testing not only the layer in which the circuit may be located, but also additional layers of the stack and interlayer interconnects. An electrical connection may be formed between the bottom-layer silicon chip and the semiconductor structure 400 by mechanically pressing the solder bumps 82 and the transferable tips 62 on the bottom-layer silicon chip together with a temperature range below the melting point of the solder bumps 82, thus forming an electrical connection without forming a permanent mechanical connection. Stated differently, at least one of the plurality of solder bumps 82 has to be electrically connected to at least one of the plurality of protrusions or transferable tips 62 through an electrical network. The electrical network electrically connecting the at least one of the plurality of solder bumps and the at least one of the plurality of protrusions may include a conductive via.

A top-layer silicon chip (not shown) to be tested may be joined to the transferable tips 62 on the top surface of the substrate layer 50. The top-layer silicon chip may also include bump connections and may be joined to transferable tips 62 following processing steps described in detail below with reference to FIG. 32A-F, FIG. 33A-D, and FIG. 34A-E. The test may be performed by using traditional, coarse-pitch probe technology. It should be noted that the test may be conducted while maintaining a mechanical force on the chip stack, as in conventional semiconductor testing. If the test result is positive, the solder bumps 82 may be reflowed to form a permanent electrical and mechanical connection with the structure underneath. In such an instance, the sharp transferable tips 62 may become the permanent interconnect with the tested top-layer silicon chip. If the test fails, the top layer silicon chip may be removed and replaced with another top layer silicon chip to be tested. Since the transferable tips 62 are very sharp, they may easily penetrate an in-situ non-flow underfill layer to make both temporary interconnect for testing and permanent interconnect later. In some embodiments, if the underfill material provides sufficient bonding strength after cure, it may be possible to form permanent interconnects without solder bump reflow. In other embodiments, one reflow may be allowed on a complete known-good-stack as will be described in detail below, thus improving product reliability by reducing the temperature for bonding and/or the number of reflows required to finish a stack or module.

Furthermore, according to an embodiment of the present disclosure, the semiconductor structure 400 exhibiting the sharp transferable tips 62 on a top side and the solder bumps 82 on a bottom side may be used to make chip stacks on a full wafer of bottom-layer die (chip-on-wafer), prior to final dicing.

Additional embodiments by which to form a semiconductor structures having solder bumps and protrusions are described in detail below by referring to the accompanying drawings in FIGS. 17-31.

Figure 17:
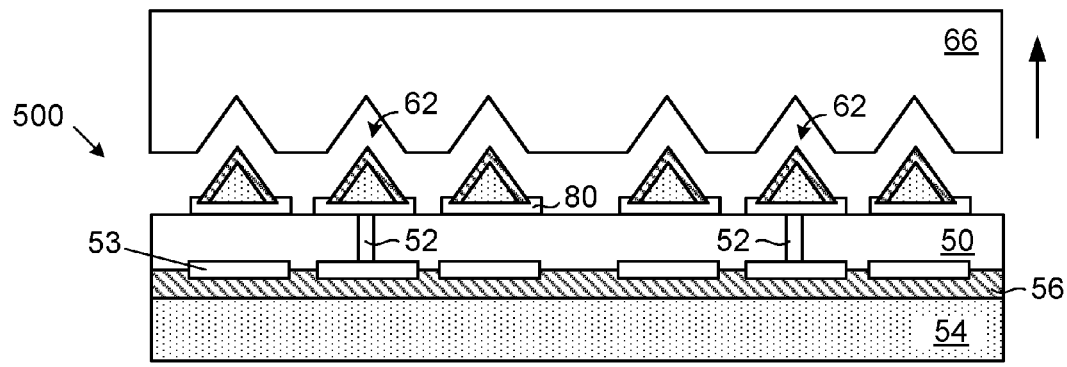
FIGS. 17-21 are cross-sectional views of a semiconductor structure depicting an alternate method of forming semiconductor structures having solder bumps and protrusions, according to an embodiment of the present disclosure.
Figure 18:
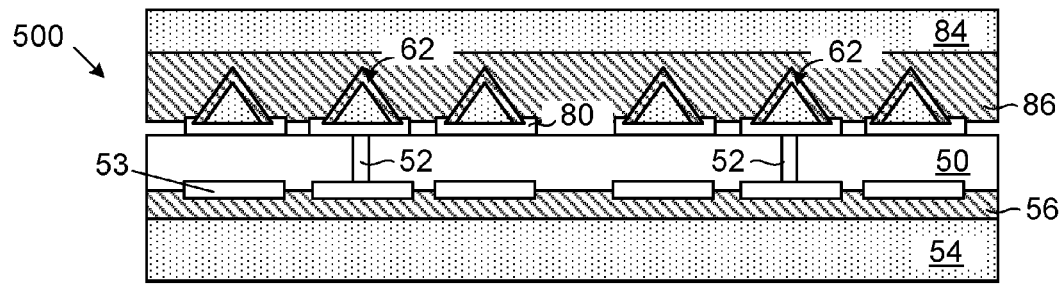

Referring now to FIGS. 17-21, an alternate method of forming semiconductor structures having solder bumps and protrusions is described, according to an embodiment of the present disclosure. A semiconductor structure 500 having similar components and formed in a similar fashion as the semiconductor structure 400, described above with reference to FIG. 14, is depicted. In this embodiment, the transferable tips 62 may be already attached to the semiconductor structure 500 and the template substrate 66 may be withdrawn as depicted in FIG. 17. A top surface of the semiconductor structure 500 containing the transferable tips 62 may be attached to a second carrier substrate 84 as shown in FIG. 18. The top surface of the semiconductor structure 500 may be attached to the second carrier substrate 84 by means of a second adhesion layer 86. The second carrier substrate 84 and the second adhesion layer 86 may include similar materials and may be formed in a similar fashion as the carrier substrate 54 and the adhesion layer 56 described above. By attaching the top surface of the semiconductor structure 500 to the second carrier substrate 84, secure handling of the thin semiconductor structure 500 may be provided during a subsequent bumping process. It should be noted that this step may be critical if a high stress may be applied to the semiconductor structure 500 during the bumping process. The processing steps previously described with reference to FIGS. 9-16 may include a controlled low-adhesion electro-deposition method that may be beneficial during processes in which a reduced stress may be applied to the semiconductor structure 500.

Figure 19:
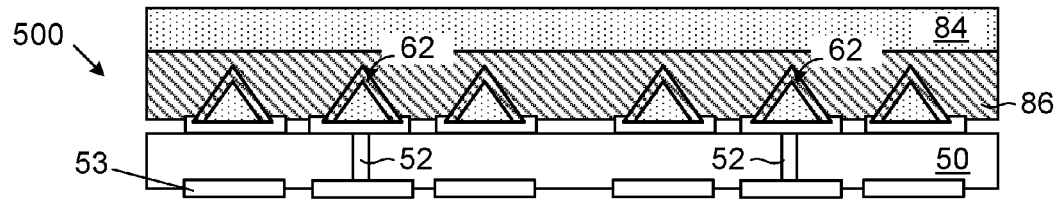
Figure 20:
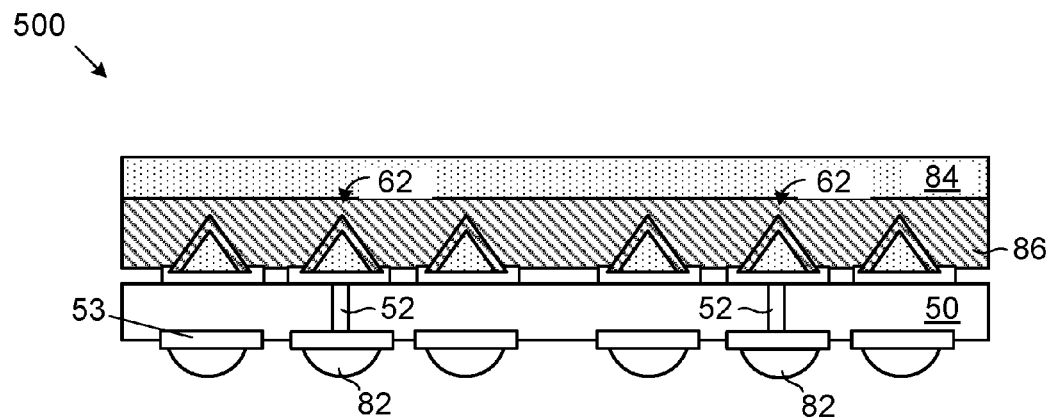
Figure 21:
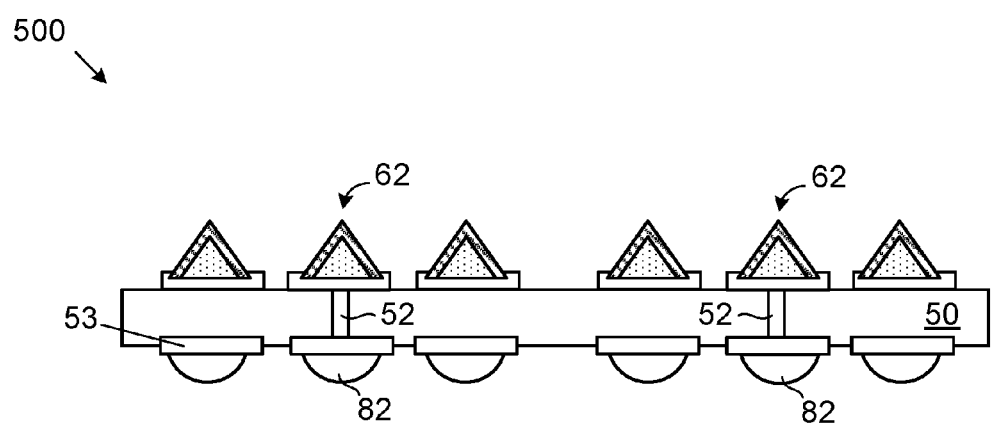

Subsequently, the carrier substrate 54 and the adhesion layer 56 may be separated from a bottom surface of the substrate layer 50 releasing the semiconductor structure 500. After releasing the semiconductor structure 500 from the carrier substrate 54, the surface pads 53 may be exposed (FIG. 19). Then, the substrate layer 50 may be bumped to form the solder bumps 82 (FIG. 20). Once the solder bumps 82 have been formed in the semiconductor structure 500, the second carrier substrate 84 and the second adhesion layer 86 may be separated from the substrate layer 50 releasing the semiconductor structure 500 as shown in FIG. 21. The second carrier substrate 84 and the second adhesion layer 86 may be separated from the semiconductor structure 500 by using physical or chemical release methods, such as laser releasing, chemical solvents, heat, etc.

The resulting semiconductor structure 500 (FIG. 21) may include sharp transferable tips 62 on one side of the substrate layer 50 and solder bumps 82 on the other side of the substrate layer 50 similar to the semiconductor structure 400 shown in FIG. 16 but formed in an alternate fashion. The transferable tips 62 and the solder bumps 82 may provide an interconnection between additional 2.5D or 3D layers for appropriate testing as will be described in detail below.

Figure 22:
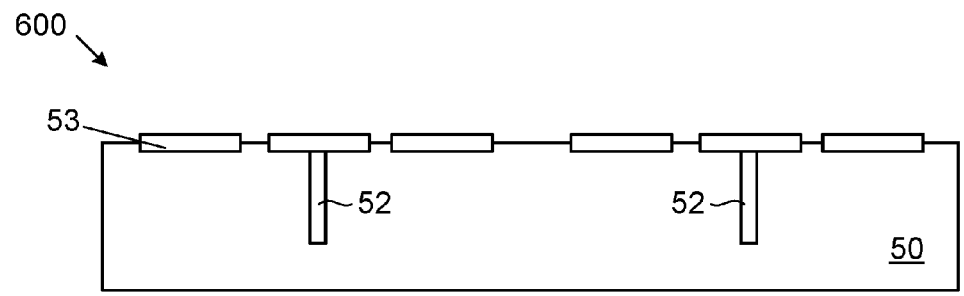
FIGS. 22-26 are cross-sectional views of a semiconductor structure depicting an alternate method of forming semiconductor structures having solder bumps and protrusions, according to an embodiment of the present disclosure.
Figure 23:
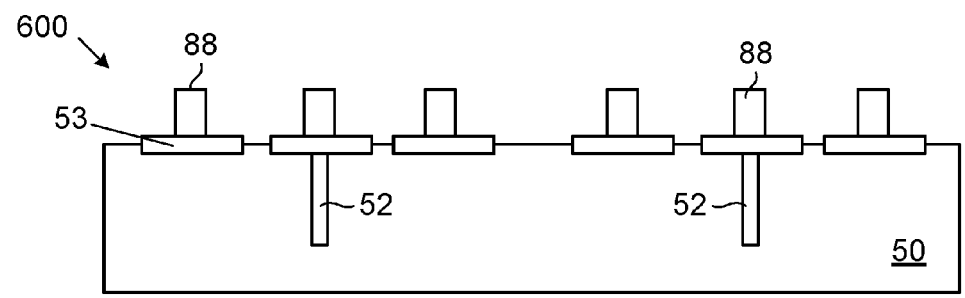
Figure 24:
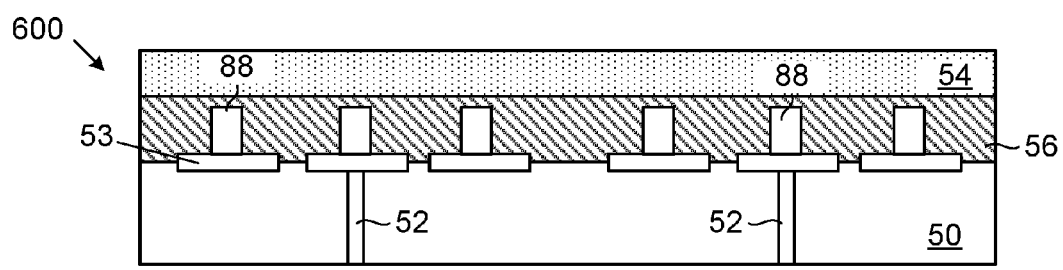

Referring now to FIGS. 22-26, an alternate method of forming semiconductor structures having solder bumps and protrusions is described, according to an embodiment of the present disclosure. A semiconductor structure 600 containing interconnect structures 52 and surface pads 53 formed in a substrate layer 50 is depicted in FIG. 22. The semiconductor structure 600 may be similar to the semiconductor structure 400 described above with reference to FIG. 9. Subsequently a plurality of pins 88 (hereinafter "pins"), shown in FIG. 23, may be formed on top of the surface pads 53. The pins 88 may include any material mechanically and electrically stable including, but not limited to, Cu, Ni, Au, Co, Fe, W, and Mo. In one embodiment, the pins 88 may be electroplated to the interconnect structures 52 to a thickness of approximately 5 μm to approximately 50 μm. It should be noted that pins formed by through-mask plating may include a wider variety of metals than transferable tips. Formation of transferable tips (e.g. transferable tips 62) may be limited to materials that may be stably deposited on the selected seed with substantially low adhesion.

Figure 25:
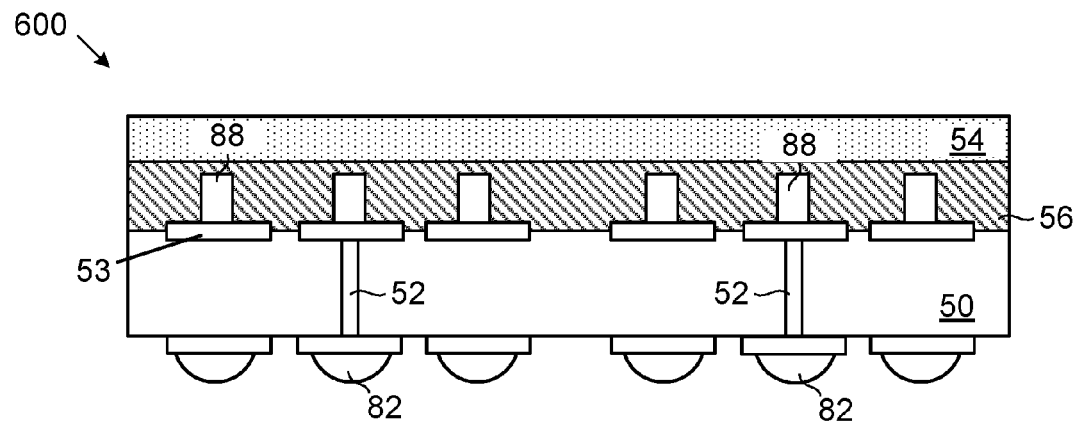
Figure 26:
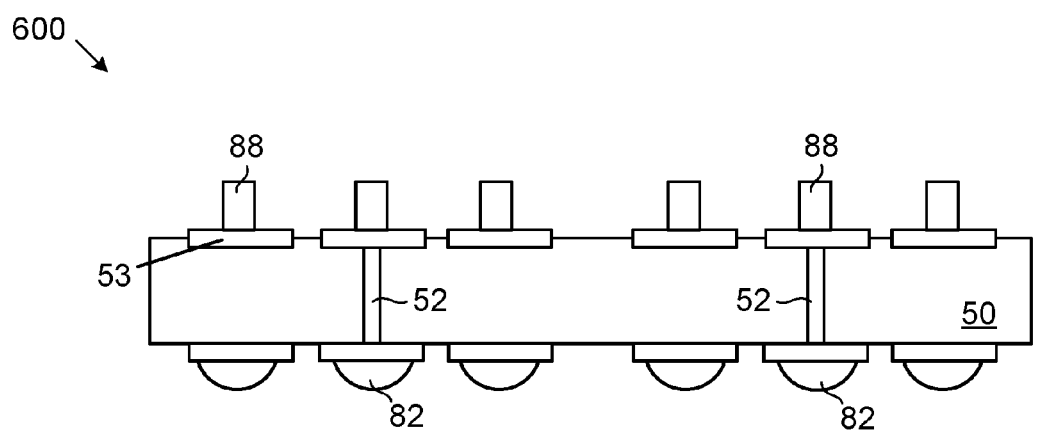
Figure 27:
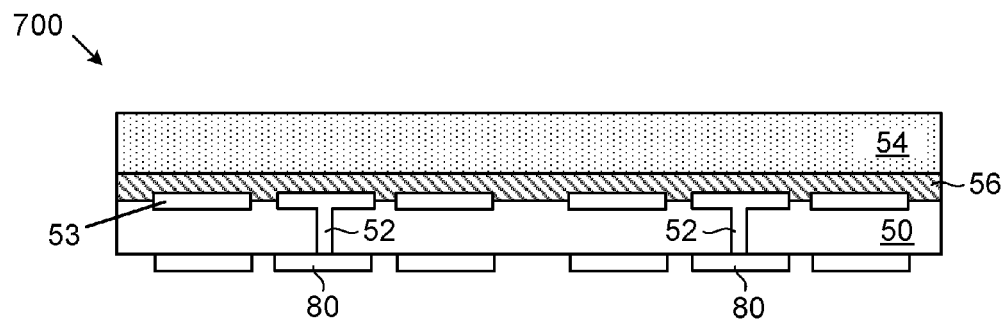
FIGS. 27-31 are cross-sectional views of a semiconductor structure depicting an alternate method of forming semiconductor structures having solder bumps and protrusions, according to an embodiment of the present disclosure.
Figure 28:
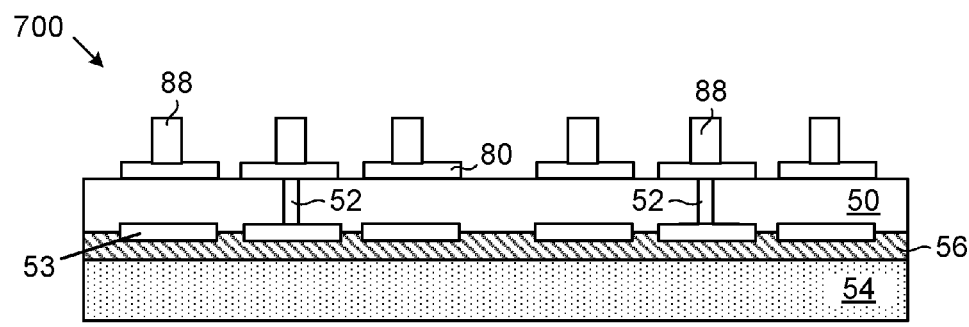

The substrate layer 50 may then be attached to the carrier substrate 54 (FIG. 24) by means of the adhesion layer 56. A backside thinning and metallization process may be conducted in the semiconductor structure 600 followed by bumping of the substrate layer 50 to form the solder bumps 82 as shown in FIG. 25. Once the solder bumps 82 have been formed in the semiconductor structure 600, the carrier substrate 54 and the adhesion layer 56 may be separated from the substrate layer 50 releasing the semiconductor structure 600. Alternatively, chips may be diced before separating the carrier substrate 54 and the adhesion layer 56 from the substrate layer 50. The carrier substrate 54 and the adhesion layer 56 may be separated from the semiconductor structure 600 by physical or chemical release methods such as, for example, laser releasing, chemical solvents, heat, etc.

The resulting semiconductor structure 600 (FIG. 26) may include the pins 88 on one side of the substrate layer 50 and solder bumps 82 on the other side of the substrate layer 50. The pins 88 and solder bumps 82 may provide an interconnection between additional 2.5D or 3D layers for appropriate testing.

It should be noted that the pins 88 may be substantially similar in function to the transferable tips 62 described above. Therefore, hereinafter the more general term "protrusions" will be used when referring to transferable tips (e.g. transferable tips 62) and/or pins (e.g. the pins 88).

Figure 29:
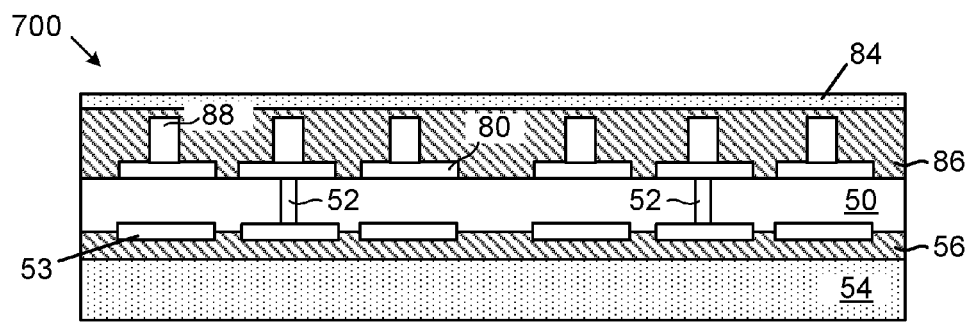
Figure 30:
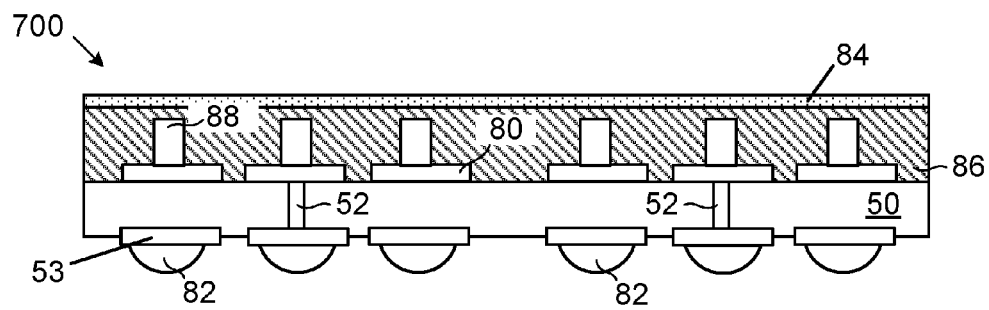
Figure 31:
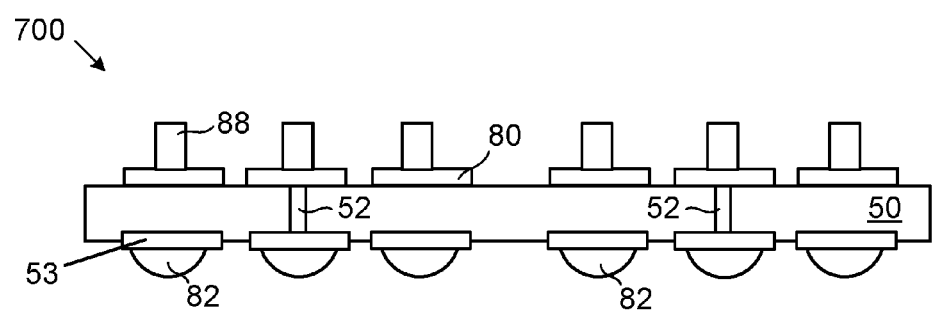

Referring now to FIGS. 27-31, an alternate method of forming semiconductor structures having solder bumps and protrusions is described, according to an embodiment of the present disclosure. A semiconductor structure 700 is shown attached to the carrier substrate 54 by means of the adhesion layer 56. At this step, a backside metallization process may be conducted in the semiconductor structure 700 to form the metal connections 80. The semiconductor structure 700 may then be flipped (FIG. 28) and a photolithography and plating process may be conducted to form the pins 88 on the metal connections 80. After forming the pins 88, the semiconductor structure 700 may be attached to the second carrier substrate 84 by means of the second adhesion layer 86 (FIG. 29). In some embodiments, attaching the semiconductor structure 700 to the second carrier substrate 84 may protect relatively fragile active devices having low-k dielectric formed on a front-side of the substrate layer 50. More specifically, by fabricating the pins 88 on a backside of the substrate layer 50, the relatively fragile active devices may be protected from excessive stress when the pins 88 penetrate solder bumps during test and assembly at temperatures below their melting temperature. The carrier layer 54 and adhesion layer 56 may be withdrawn and the substrate layer 50 may be bumped to form the solder bumps 82 on the bottom portion of the semiconductor structure 700 as depicted in FIG. 30. Once the solder bumps 82 have been formed, the second carrier substrate 84 and the second adhesion layer 86 may be separated from the semiconductor structure 700 by using physical or chemical release methods, such as laser releasing, chemical solvents, heat, etc. Alternatively, chips may be diced prior to separating the second carrier substrate 84 and the second adhesion layer 86 from the semiconductor structure 700. The resulting semiconductor structure 700 (FIG. 31) may include pins 88 on one side of the substrate layer 50 and solder bumps 82 on the other side of the substrate layer 50. The pins 88 and solder bumps 82 may provide an interconnection between additional 2.5D or 3D layers for appropriate testing.

Additional embodiments by which to conduct test and assembly of 2.5D or 3D structures using the semiconductor structures having solder bumps and protrusions previously described are explained in detail below by referring to the accompanying drawings in FIGS. 32A-36B.

Referring now to FIGS. 32A-32F, a sequence of processing steps describing the use of semiconductor structures with protrusions, solder bumps, and reworkable interconnects for assembly and test of 2.5D or 3D structures is depicted, according to an embodiment of the present disclosure. More specifically, a capillary underfill material and a layer by layer cure method may be used to hold together a plurality of layers or substrates in a 3D/2.5D stack. The capillary underfill material may be cured in a succession as each of a plurality of tested dies may be added to the stack of dies as will be described in detail below.

Figure 32B:
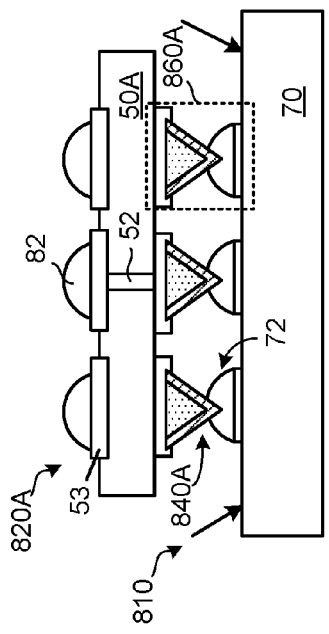
Figure 32A:
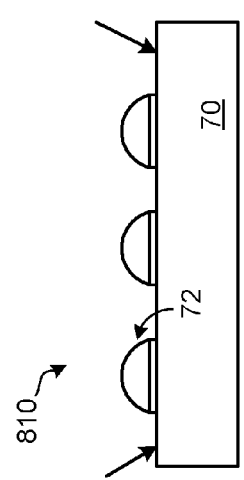

At this point of the manufacturing process, a functional substrate 70 containing solder bumps 72 may be formed or provided (FIG. 32A). The functional substrate 70 may include a full thickness chip or wafer. In this embodiment, the functional substrate 70 may include a known-good die (KGD) structure 810. KGD structures may include semiconductor dies that have been fully tested to a determined level of quality prior to being used.

As an illustration only, without intent of limitation, the KGD structure 810 includes the solder bumps 72. It should be noted that the KGD structure 810 (FIG. 32A) may include a plurality of protrusions instead of the solder bumps 72. As described above, the term "protrusions" may include tips (including transferable tips) or pins (including transferable tips).

A first device under test (DUT) 820A may be placed on top of the functional substrate 70. The first device under test 820A may include a substrate layer 50A containing protrusions 840A electrically connected to interconnect structures 52 and solder bumps 82. In this embodiment, the protrusions 840A may include transferable tips. According to this embodiment, the sharp tips of the protrusions 840A may penetrate the solder bumps 72 (FIG. 32B) forming an electrical connection. It should be noted that the protrusions 840A penetrating the solder bumps 72 may form a reworkable interconnect structure 860A (FIG. 32B).

The underneath KGD structure 810 is known to function appropriately and is capable of testing the reworkable interconnects 860A formed by the protrusions 840A and the solder bumps 72. If the test result is positive such that the functional substrate 70, the substrate layer 50A and the reworkable interconnects 860A are all functioning, the solder bumps 72 may be reflowed to form a permanent bond between the functional substrate 70 (first layer) and the substrate layer 50A (second layer). An underfill 90 (FIG. 32C) may be subsequently formed in the space between the substrate layer 50A, the functional substrate 70, the protrusions 840A and the solder bumps 72 to lock a known-good partial stack 880 according to known technologies. For example, the underfill 90 may include an electrically-insulating adhesive to securely bond the functional substrate 70 (first layer) to the substrate layer 50A (second layer).

Figure 32D:
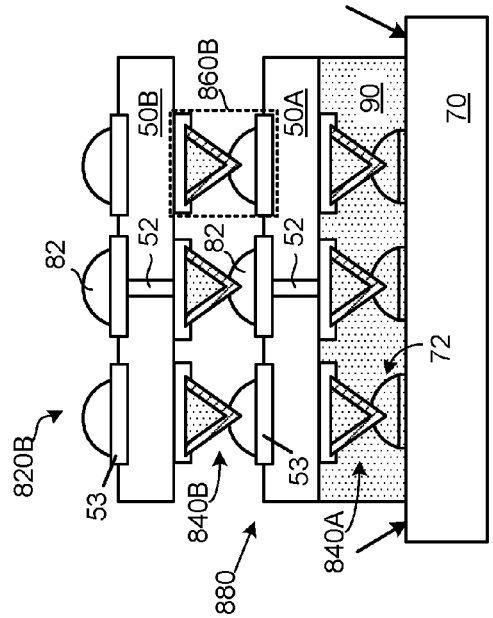
Figure 32C:
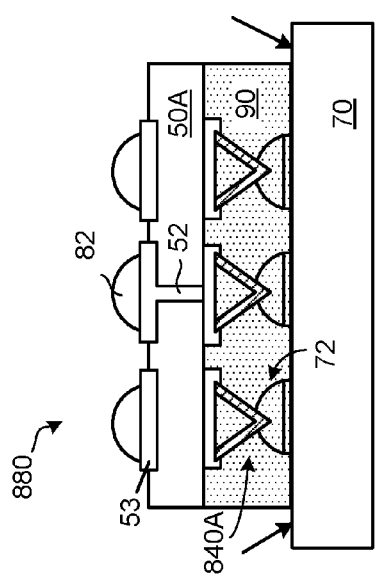

Then, a second device under test (DUT) 820B may be placed on top of the known-good partial stack 880 (FIG. 32D). The second device under test 820B may include a substrate layer 50B (third layer) containing protrusions 840B on one side of the substrate layer 50B electrically connected to interconnect structures 52, and solder bumps 82 on the other side of the substrate layer 50B. In this embodiment, the protrusions 840B may include transferable tips. The second DUT 820B may be attached to the known-good partial stack 880 following the procedure previously described with reference to FIGS. 32B-32C. More specifically, the protrusions 840B of the substrate layer 50B (FIG. 32D) may penetrate the solder bumps 82 of the known-good partial stack 880 forming an electrical connection suitable for testing.

If the result of testing the substrate layer 50B, known-good partial stack 880, and the reworkable interconnects 860B is positive (FIG. 32E) such that they are all functioning, the solder bumps 82 of the known-good partial stack 880 may be reflowed to form a permanent bond between the substrate layer 50B and the known-good partial stack 880. Next, as described above, an underfill 90 (FIG. 32E) may be subsequently formed in the space between the substrate layer 50B and the substrate layer 50A according to known technologies. For example, the underfill 90 may include an electrically-insulating adhesive to securely bond the substrate layer 50B and the substrate layer 50A. The known-good partial stack 880 and the attached substrate layer 50B may now form a known-good stack 890. It may be understood that the reflowing of the solder bumps 82 and formation of the underfill 90 described above with reference to FIGS. 32D-32E may occur only if all the components of the known-good partial stack 880 and substrate layer 50B are functioning.

If the test result is negative (test fails), the substrate layer 50B may be withdrawn as depicted in FIG. 32F, then another structure may be attached for testing and assembly (not shown).

Referring now to FIGS. 33A-33D, a sequence of processing steps describing the use of semiconductor structures with protrusions, solder bumps and reworkable interconnects for assembly and test of 2.5D or 3D structures is described, according to an embodiment of the present disclosure. More specifically, a pre-applied underfill and all-at-once reflow may be employed to form a 3D/2.5D stack. It should be noted that the step by step reflow and cure method described above with reference to FIGS. 32A-32F may also be used with the pre-applied underfill method described in the present embodiment. The initial structure shown in FIG. 33A may include a functional substrate 70 containing solder bumps 72. The functional substrate 70 may include a full thickness chip or wafer. It should be noted that, in this embodiment, the functional substrate 70 may include a known-good semiconductor chip or wafer. The substrate 70 may be coated with a pre-applied underfill 90. A semiconductor structure 900 may be form or provided. The semiconductor structure 900 may be, for example, a device under test (DUT). The semiconductor structure 900 may include protrusions 840A on one side of a substrate layer 50A and solder bumps 82 on the other side of the substrate layer 50A. The protrusions 840A of the semiconductor structure 900 may be inserted in the solder bumps 72 formed in the functional substrate 70 for testing of the semiconductor structure 900 as depicted in FIG. 33B. The underfill 90 may be disposed between the mating surfaces of the substrate layer 50A and the functional substrate 70.

Next, an electrical test may be conducted to test the substrate layer 50A (FIG. 33B). If the test result is negative (FIG. 33D) the substrate layer 50A may be removed and another substrate layer 50A (not shown) may be provided for testing. Conversely, if the test result is positive (FIG. 33C), the functional substrate 70 may be securely bonded to the substrate layer 50A. In one embodiment, the functional substrate 70 and the substrate layer 50A may be held together by applying a higher force and pressing for a stronger bond between the functional substrate 70 and the substrate layer 50A. In another embodiment, the pre-applied underfill 90 may be cured to a certain degree of cure to hold the substrate layer 50A and the functional substrate 70 to form a known-good partial stack 920. The cured underfill material may substantially fills a space between the substrate layer 50A and the functional substrate 70, surrounding the protrusions 840A and the solder bumps 72. At this point of the testing procedure, another substrate layer 50B may be connected to the known-good partial stack 920 for further testing (FIG. 33C) repeating the steps previously described.

If again the test is positive all the tested structures may be joined together by simultaneously reflowing the solder bumps 72 and the solder bumps 82 and entirely curing the underfill 90.

It may be understood that the testing process described in the present embodiment may start with a functional substrate 70 having a plurality of protrusions (e.g. tips or pins) instead of the solder bumps 72.

Referring now to FIGS. 34A-34E, a sequence of processing steps describing the use of semiconductor structures with protrusions, solder bumps, and reworkable interconnects for assembly and test of 2.5D or 3D structures is described, according to an embodiment of the present disclosure. A functional substrate 92 containing protrusions 94 (FIG. 34A) may be formed or provided according to the method and techniques described above. The protrusions 94 may include transferable tips or pins. The functional substrate 92 may include a full thickness chip or wafer. In this embodiment, the functional substrate 92 is a known-good die (KGD) structure including a pre-designed circuitry. A semiconductor structure 940, depicted in FIG. 34B, containing transferable tips 62 on a bottom surface of a substrate 96 and solder bumps 82 on an upper surface of the substrate 96 may be formed or provided. The transferable tips 62 in the substrate 96 may be attached to a template substrate 98 similar to the template substrate 66 (FIG. 5). The substrate 96 may include a chip or wafer to be tested. The substrate 96 may be coated with an underfill 90 and may be diced, as indicated by dotted line A-A. The substrate 96 may be diced using a standard dicing technique or a dice-before-grind (DBG) technique. The standard dicing technique may involve dicing through the entire thickness of a substrate or wafer which has previously been ground to a desired final thickness. The dice-before-grind technique may typically involve forming shallow dicing channels in a full-thickness substrate or wafer before being thinned. It should be noted that the template substrate 98 may not be diced, in this embodiment only the substrate 96 may be diced. It should also be noted that the underfill 90 may be applied before dicing the substrate 96 and before joining the functional substrate 92 and the substrate 96.

Figure 34A:
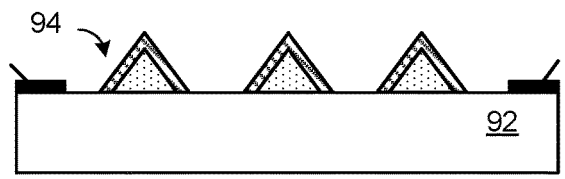
Figure 34B:
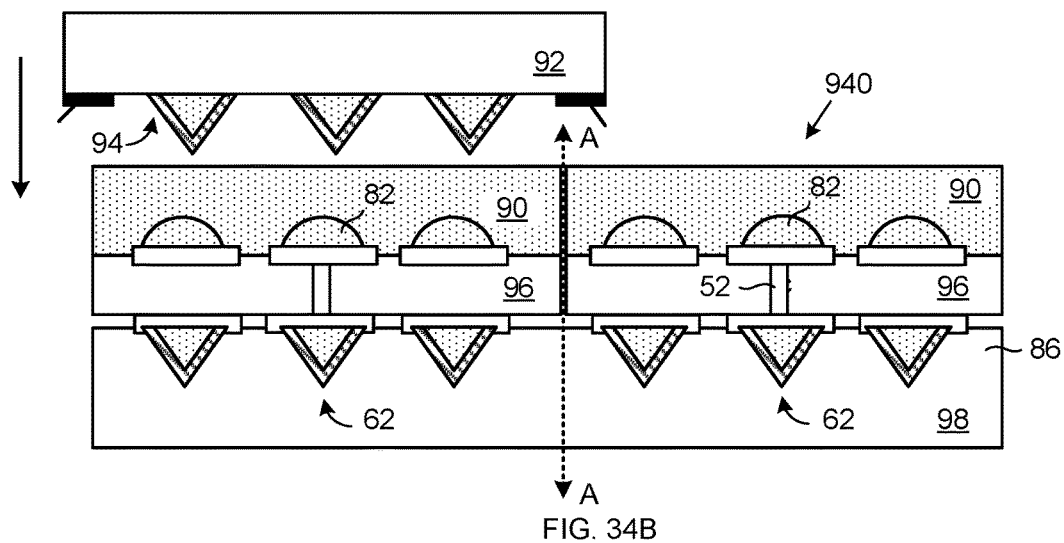

By dicing the substrate 96, individual dies may be formed. The functional substrate 92 may then be joined to a previously diced portion or die of the substrate 96 by using a typical flip-chip procedure as depicted in FIG. 34B. It should be noted that due to the sharp tips of the protrusions 94, they may easily penetrate the underfill 90 and the solder bumps 82 in the substrate 96.

Once the protrusions 94 in the functional substrate 92 have penetrated the solder bumps 82 and the underfill 90 in the selected die of substrate 96, the functional substrate 92 may be temporarily joined to the selected die of the substrate 96 to be tested. The testing may be performed before or after being released from the template substrate 98 (FIG. 34C).

If the test is positive (FIG. 34D), the functional substrate 92 may be permanently bonded to the tested portion or die of the substrate 96 by reflowing the solder bumps 82 and/or curing the underfill 90. Then additional substrates 96, including protrusions 94 and solder bumps 82, may be attached for testing by following the steps described above. It should be noted that reflow may not be required at each layer since the presence of the underfill 90 may be enough to hold all the tested layers together. Following the methodology described above, additional substrates or layers may be assembled and tested to form a known-good stack 941. After assembling the known-good stack 941, all solder bumps 82 in the multi-layer stack may be reflowed, and layers with the pre-applied underfill may be completely cured. Additionally, all reworkable interconnect structures may be converted to permanent interconnects. By doing so, the ultra-thin substrate 96 may be handled efficiently in regular traditional pick-and-place manner using the controlled low-adhesion template substrate 98, integrated testing, and reworkable interconnects. This may help avoiding uncertainties caused by individual handling procedures in debonding, testing, assembly and transfer processes during the above steps, which may result in lower yield caused by electrical and mechanical failure, contamination, operator mistakes, etc.

If the test is negative (FIG. 34E), the tested portion of the substrate 96 may be detached from the functional substrate 92 and replaced with another portion of the substrate 96 for assembly and testing (not shown). It may be understood that defective dies may be removed before forming the chip stack.

Referring now to FIGS. 35A-35B, a sequence of processing steps describing the use of semiconductor structures with protrusions, solder bumps, and reworkable interconnects for assembly and test of 2.5D or 3D structures is described, according to an embodiment of the present disclosure. More specifically, a plurality of 2.5D or 3D structures to be tested may be attached to a substrate 110 mounted on an integrated heating-cooling system 112. The substrate 110 may be a known-good die used to test a substrate layer 50 and a subsequently attached package substrate 113 (FIG. 35B). The substrate layer 50 containing interconnect structures 52 and protrusions 840 may be attached to the solder bumps 82 formed on a top surface of the substrate 110. The integrated heating-cooling system 112 may control the temperature such that tests may be performed at certain temperatures. A thermal interface material (TIM) 111 may be applied between the integrated heating-cooling system 112 and the substrate 110 to improve thermal conductivity. In one embodiment, the integrated heating-cooling system 112 may include a heat element. In another embodiment, the integrated heating-cooling system 112 may include a cooling fluid such as, for example, chilled water, ethylene glycol, liquid nitrogen, etc.

If the test result is positive (FIG. 35B), additional structures or substrate layers 50 to be tested may be attached by following the methodology described above. The package substrate 113 may be added to the last layer of the stack in order to form a functional module with C4 bumps 114 at approximately 150 µm pitch or larger. At a final stage of the testing process, a probe card 116 (FIG. 35B) may be used to test the stacks with the C4 bumps 114, in order to certify the quality of the final stack. The process of attaching or transferring the probe card 116 may be typical and well known to those skilled in the art. It should be noted that reflow and complete cure of the underfill 90 may not be required until all of the substrate layers 50 have been assembled and tested.

Figure 36A:
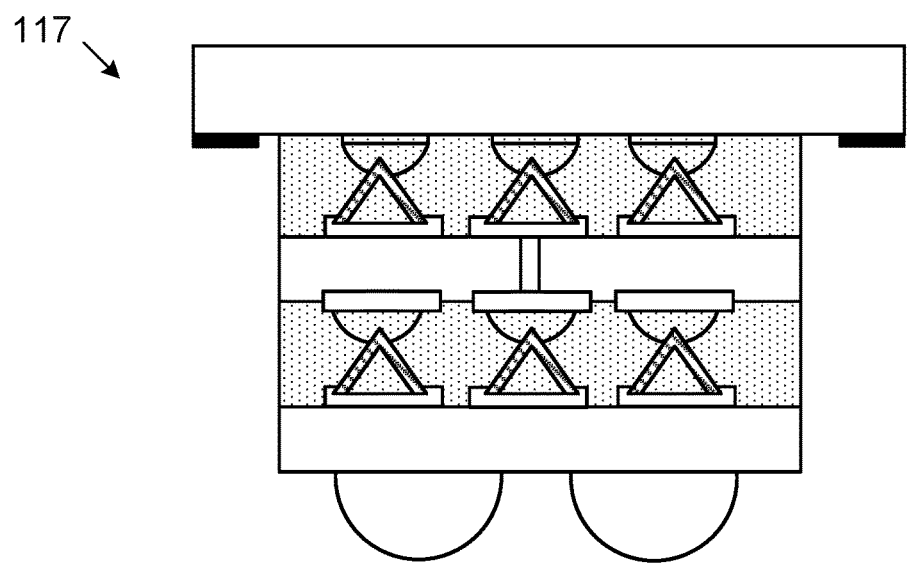
FIGS. 36A-36B are cross-sectional views of a semiconductor structure depicting using reworkable interconnects for assembly and test of 2.5D or 3D structures, according to an embodiment of the present disclosure.
Figure 36B:
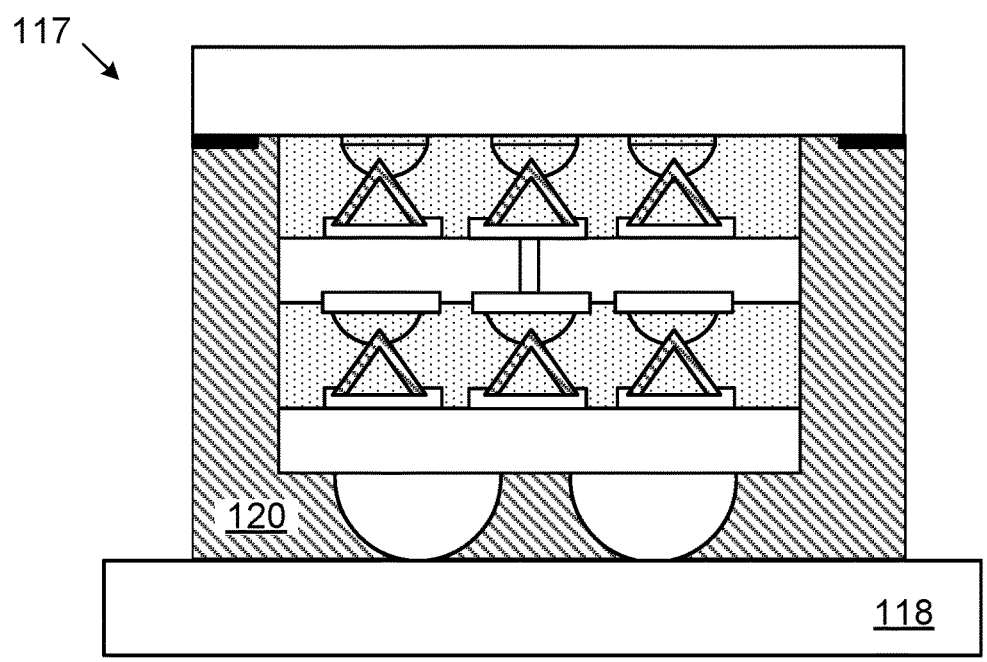

Referring now to FIGS. 36A-36B, a method of using a 3D chip scale package (CSP) is described, according to an embodiment of the present disclosure. More specifically, a 2.5D or 3D known-good stack 117 may be shipped to customers after bumping it to a CSP 118. In some embodiments, the 2.5D or 3D known-good stack 117 may be shipped "as is" if the customer decides to bump the substrate. The CSP 118 may be bonded to a package substrate of any form using any suitable metallurgy and pitch. Then an underfill 120 may be applied for better reliability.

Therefore, by forming semiconductor structures having protrusions on one side of a 2.5D or 3D semiconductor substrate and solder bumps on the other side of the semiconductor substrate and reworkable interconnect comprising pairs of protrusions and solder bumps on adjacent layers, different testing and rework modalities may be conducted prior to final reflow that may improve device yield and may reduce test and assembly costs. Among the benefits of forming reworkable interconnect structures may be, fine pitch protrusions may become permanent interconnects, the need to clean fine pitch testing probe heads as well as testing probes wearing may be reduced, simultaneous testing of multiple layers and interconnects, and the number of tests performed may be reduced. Additionally, substantially low insertion force may be required to form temporary interconnects which may facilitate testing and release of the probe tip, by reworking the interconnects at ambient temperature reflow and solder hierarchy may be avoided, permanent joints may be formed on known-good stacks only, and high yield of different underfill options may be enabled. Further, temporary electrical interconnections may be broken if a first substrate and a second substrate are separated. If all tested devices are functional a heat treatment may be applied to the temporary electrical interconnections to create a permanent electrical interconnection.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
    an electrical interconnection between a first substrate comprising a plurality of protrusions and a second substrate comprising a plurality of solder bumps,
    wherein the plurality of protrusions comprises sharp metal tips that penetrate the plurality of solder bumps,
    wherein the plurality of solder bumps comprises an array of micro-bumps or micro-pillars, and
    wherein physical contact between the plurality of protrusions and the plurality of solder bumps forms a metallurgical joint establishing said electrical interconnection.

2. The structure of claim 1, wherein the first substrate and the second substrate comprise a silicon wafer or an individual chip of silicon, glass, ceramic, or organic laminate material.

3. The structure of claim 1, wherein the plurality of protrusions comprises an array of transferable metal tips or pins.

4. The structure of claim 1, wherein said electrical interconnection is permanent and a cured underfill material is disposed between mating surfaces of the first substrate and the second substrate, and wherein the cured underfill material substantially fills a space between the first substrate and the second substrate, surrounding the plurality of protrusions and the plurality of solder bumps.

5. A structure comprising:
    a substrate comprising a plurality of protrusions on a surface of the substrate; and
    a plurality of solder bumps on an opposite surface of the substrate, wherein the plurality of protrusions comprises substantially sharp metal tips that penetrate a solder compound forming the plurality of solder bumps, wherein the plurality of solder bumps comprises an array of micro-bumps or micro-pillars, and wherein an electrical connection exists between the plurality of protrusions penetrating the plurality of solder bumps.

6. The structure of claim 5, wherein the substrate comprises a silicon wafer or an individual chip of silicon, glass, ceramic, or organic laminate material.

7. The structure of claim 5, wherein at least one of the plurality of solder bumps has to be electrically connected to at least one of the plurality of protrusions through an electrical network, and wherein the electrical network electrically connecting the at least one of the plurality of solder bumps and the at least one of the plurality of protrusions comprises a conductive via.

8. A structure comprising:
an electrical interconnection between a first substrate comprising a plurality of protrusions on a first surface of the first substrate;
a second substrate comprising a plurality of solder bumps on a first surface of the second substrate; and
a plurality of protrusions on a second opposite surface of the second substrate,
wherein an electrical interconnection exist within the second substrate between the plurality of solder bumps and the plurality of protrusions on the second substrate,
wherein the plurality of protrusions on the first substrate comprises sharp tips that penetrate the plurality of solder bumps on the second substrate,
wherein a permanent electrical interconnection is established by physical contact between the plurality of protrusions on the first substrate and the plurality of solder bumps on the second substrate comprising a metallurgical joint.

9. The structure of claim 8, wherein at least one of the plurality of solder bumps on the second substrate has to be electrically connected to at least one of the plurality of protrusions on the second substrate through an electrical network, and wherein the electrical network electrically connecting the at least one of the plurality of solder bumps and the at least one of the plurality of protrusions comprises a conductive via.

10. The structure of claim 8, further comprising:
a temporary electrical interconnection between the plurality of protrusions on the first substrate and the plurality of solder bumps on the second substrate, wherein a heat treatment is applied to the temporary electrical interconnection to create the permanent electrical interconnection, wherein the temporary electrical interconnection is broken if the first substrate and the second substrate are separated; and
an additional substrate electrically connected to the first substrate and the second substrate comprising a stack of dies.

11. A structure comprising:
an electrical interconnection between a first substrate comprising a plurality of protrusions and a second substrate comprising a plurality of solder bumps,
wherein the plurality of protrusions comprises sharp metal tips that penetrate the plurality of solder bumps,
wherein the plurality of protrusions further comprises an array of transferable tips or pins, and
wherein said electrical interconnection is established by physical contact between the plurality of protrusions and the plurality of solder bumps, each forming a metallurgical joint.

12. The structure of claim 11, wherein the first substrate and the second substrate comprise a silicon wafer or an individual chip of silicon, glass, ceramic, or organic laminate material.

13. The structure of claim 11, wherein said electrical interconnection is a temporary electrical interconnection made permanent by a heat treatment, whereby prior to the heat treatment the first substrate and the second substrate are separable by braking the temporary electrical interconnection.

14. A structure comprising:
an electrical interconnection between a first substrate comprising a plurality of protrusions and a second substrate comprising a plurality of solder bumps,
wherein the plurality of protrusions comprises sharp metal tips that penetrate the plurality of solder bumps,
wherein said electrical interconnection is established by physical contact between the plurality of protrusions and the plurality of solder bumps, each forming a metallurgical joint, and
wherein a cured underfill material is disposed between mating surfaces of the first substrate and the second substrate, and wherein the cured underfill material substantially fills a space between the first substrate and the second substrate, surrounding the plurality of protrusions and the plurality of solder bumps.

15. The structure of claim 14, wherein the first substrate and the second substrate comprise a silicon wafer or an individual chip of silicon, glass, ceramic, or organic laminate material.

16. The structure of claim 1, wherein said electrical interconnection is a temporary electrical interconnection made permanent by a heat treatment, whereby prior to the heat treatment the first substrate and the second substrate are separable by braking the temporary electrical interconnection.

17. The structure of claim 14, wherein said electrical interconnection is a temporary electrical interconnection made permanent by a heat treatment, whereby prior to the heat treatment the first substrate and the second substrate are separable by braking the temporary electrical interconnection.

* * * * *